(12) United States Patent
Odille et al.

(10) Patent No.: US 9,140,770 B2
(45) Date of Patent: Sep. 22, 2015

(54) METHOD FOR RECONSTRUCTING A SIGNAL FROM DISTORTED EXPERIMENTAL MEASUREMENTS AND DEVICE FOR ITS IMPLEMENTATION

(75) Inventors: Freddy Odille, Labaffe (FR); Pierre-André Vuissoz, Villers-les-Nancy (FR); Jacques Felblinger, Merveille (FR)

(73) Assignee: UNIVERSITE DE LORRAINE, Nancy (FR)

(*) Notice: Subject to any disclaimer, the term of this patent is extended or adjusted under 35 U.S.C. 154(b) by 732 days.

(21) Appl. No.: 12/743,055

(22) PCT Filed: Nov. 14, 2008

(86) PCT No.: PCT/FR2008/001601
§ 371 (c)(1),
(2), (4) Date: Sep. 24, 2010

(87) PCT Pub. No.: WO2009/098371
PCT Pub. Date: Aug. 13, 2009

(65) Prior Publication Data
US 2011/0022375 A1    Jan. 27, 2011

(30) Foreign Application Priority Data

Nov. 14, 2007   (FR) ..................................... 07 08003

(51) Int. Cl.
*G06F 7/60* (2006.01)
*G06F 17/10* (2006.01)
(Continued)

(52) U.S. Cl.
CPC ...... *G01R 33/5611* (2013.01); *G01R 33/56509* (2013.01); *G01R 33/5608* (2013.01); *G01R 33/5676* (2013.01)

(58) Field of Classification Search
CPC ........... G01R 33/5608; G01R 33/5611; G01R 33/56509; G01R 33/5676
USPC ............................................................. 703/2
See application file for complete search history.

(56) References Cited

U.S. PATENT DOCUMENTS 4,701,706 A    10/1987  Haacke
5,477,144 A *  12/1995  Rogers, Jr. .................... 600/413
(Continued)

OTHER PUBLICATIONS

Bammer et al., Augmented Generalized SENSE Reconstruction to Correct for Rigid Body Motion, Magnetic Resonance in Medicine, 57:90-102 (2007).*

(Continued)

*Primary Examiner* — Aniss Chad
(74) *Attorney, Agent, or Firm* — Young & Thompson

(57) ABSTRACT

A method for acquiring (1) experimental measures with interferences of a physical phenomenon, and for reconstructing (2) a point-by-point signal (3) representative of the phenomenon according to at least one dimension that can vary during the experimental measure acquisition, using at least one simulation model (4) of at least one acquisition chain of the experimental measures including at least one interference, and at least one model (8) of each interference in each acquisition chain, each interference model being determined at least from the measures themselves, wherein the simulation and interference models include adjustable parameters (6, 10) depending on experimental conditions, wherein at least one adjustable parameter of one of the models is coupled to at least one adjustable parameter of the other model, and in that the adjustable parameters are optimized in a coupled manner. A device for MRI imaging, NMR, or medical imaging using such a method is described.

26 Claims, 7 Drawing Sheets

(51) Int. Cl.
*G01R 33/561* (2006.01)
*G01R 33/565* (2006.01)
*G01R 33/56* (2006.01)
*G01R 33/567* (2006.01)

(56) References Cited

U.S. PATENT DOCUMENTS

2003/0120163 A1* 6/2003 Rudy et al. .............. 600/509
2005/0113671 A1* 5/2005 Salla et al. .............. 600/413
2007/0182411 A1 8/2007 Bammer et al.

OTHER PUBLICATIONS

Batchelor et al., Matrix Description of General Motion Correction Applied to Multishot Images, Magnetic Resonance in Medicine, 54:1273-128 (2005).*
Brox et al., High Accuracy Optical Flow Estimation Based on a Theory of Warping, in Proc. 8th European Conference on Computer Vision, Springer LNCS 3024, T. Pajdla and J. Matas (Eds.), vol. 4, pp. 25-36, Prague, Czech Republic, May 2004.*
Hornak, Introduction, The Basics of MRI, http://web.archive.org/web/20000817210411/http://www.cis.rit.edu/htbooks/mri/inside.htm (2000), retrieved Mar. 8, 2013.*
Maes et al., Comparative evaluation of multiresolution optimization strategies for multimodality image registration by maximization of mutual information, Medical Image Analysis (1999) vol. 3, No. 4, pp. 373-386.*
Manke et al., Novel Prospective Respiratory Motion Correction Approach for Free-Breathing Coronary MR Angiography Using a Patient-Adapted Affine Motion Model, Magnetic Resonance in Medicine, 50:122-131 (2003).*
Nehrke et al., Prospective Correction of Affine Motion for Arbitrary MR Sequences on a Clinical Scanner, Magnetic Resonance in Medicine, 54:1130-1138 (2005).*
Rueckert et al., Nonrigid Registration Using Free-Form Deformations: Application to Breast MR Images, IEEE Transactions on Medical Imaging, vol. 18, No. 8, Aug. 1999.*
"Data" Wikipedia, The Free Encyclopedia, Nov. 19, 2014.*
International Search Report, dated Aug. 5, 2009, from corresponding PCT application.
Odille et al., "Generalized reconstruction by inversion of coupled systems (GRICS) applied to free-breathing MRI", Magnetic Resonance in Medicine, Jun. 25, 2008, pp. 146-157, XP-002537561.
Bammer et al., "Augmented generalized SENSE reconstruction to correct for rigid body motion", Magnetic Resonance in Medicine, Dec. 26, 2006, pp. 90-102, vol. 57, XP-002482845.
Batchelor et al., "Matrix description of general motion correction applied to multishot images", Magnetic Resonance in Medicine, Sep. 9, 2005, pp. 1273-1280, XP-002482846.
Hess et al., "Maximum cross-entropy generalized series reconstruction", Biomedical Imaging, 2002, pp. III_4_1-III_4_8, XP-010659140.
Deming et al., "Computerized tomographic imaging of time-varying objects using mixture models", Computational Intelligence for Measurement Systems and Applications, 2005, pp. 322-327, XP-010845123.
Knutsson et al., "Motion artifact reduction in MRI through generalized DFT", Biomedical Imaging, 2004, pp. 896-899, XP-010774077.
Sodickson et al., "A generalized approach to parallel magnetic resonance imaging", Medical Physics, Aug. 1, 2001, pp. 1629-1643, vol. 28, No. 8, XP-01201154.
Pruessmann et al., "Advances in sensitivity encoding with arbitrary k-space trajectories", Magnetic Resonance in Medicine, Jan. 1, 2001, pp. 638-651, vol. 46, No. 4, XP-002288249.
Odille et al., "Linear predictive modeling of patient motion using external sensors", Proceedings of the International Society for Magnetic Resonance in Medicine, 2007, p. 2524, XP-002482847.

* cited by examiner

METHOD FOR RECONSTRUCTING A SIGNAL FROM DISTORTED EXPERIMENTAL MEASUREMENTS AND DEVICE FOR ITS IMPLEMENTATION

The present invention relates to a method and a device for acquiring and reconstructing a signal from distorted experimental measurements.

TECHNICAL FIELD

The present invention relates to the fields of magnetic resonance, in particular but not exclusively magnetic resonance imaging (MRI), nuclear magnetic resonance (NMR) spectroscopy and medical imaging, in the latter in particular but not exclusively tomography.

It relates more particularly, but not exclusively, to acquiring, reconstructing and obtaining MRI images.

It relates more particularly, but not exclusively, to acquiring, reconstructing and obtaining MRI images of subjects or objects that are in motion during the acquisition in order to correct the distortions caused by this said motion.

The invention can also be implemented for other procedures where a signal is reconstructed from measurements, in particular but not exclusively other medical imaging procedures, for example ultrasonography or tomography.

The invention can also be implemented in order to correct other distortions, in particular but not exclusively to establish sensitivity maps in parallel MRI, to correct artefacts in echo planar imaging (EPI) type acquisitions in MRI, to correct heterogeneities in MRI acquisitions, as well as in order to correct other artefacts caused by a distortion during experimental measurements.

The invention can also be implemented in order to modify the acquisition process adaptively, i.e. to modify, during acquisition, in particular but not exclusively the resolution of the MRI acquisition, the control of the coils correcting magnetic field heterogeneities or the magnetic field gradients while the antennae are emitting the radio frequency.

STATE OF THE PRIOR ART

Magnetic resonance imaging (MRI) is a non-invasive radiological technique based on the physical phenomenon of nuclear magnetic resonance (NMR). MRI acquisition of images of the human body involves repeating one or more basic NMR experiments, that is, a succession of excitations/acquisitions, each of these experiments allowing some of the image information to be collected, frequency encoded for example (acquisition in Fourier space). This process is sequential by nature, and therefore relatively slow.

Adaptive imaging is the set of techniques that make it possible to adapt the imaging process to the patient, so as to take into account the physiology and motion of the patient or his organs.

In the context of the imaging of the human body, and in particular in cardiac and abdominal imaging, the acquisition time is often the limiting factor. Patient motion is very often the main cause of this. In the case of motion during the acquisition, the implicit assumption of invariance of the imaged proton distribution is no longer true. This causes degradations of the image. These degradations are called artefacts, and can make interpretation of the image, and therefore diagnosis, difficult or even impossible. The patient motion can be of different kinds: respiratory motion, heart beats, vessel pulsations. Besides physiology, unintentional motion can occur, such as movements of the head or residual motion during incomplete apneas. Finally, some patients are not able to maintain the required apneas (breathing difficulties), and others may be uncooperative (children).

The need to obtain an adequate resolution involves constructing an image from several acquisitions, the required resolution directly dependent on the number of acquisitions. Each acquisition represents a part of the image information to be reconstituted. In the case of slow physiological motion in the light of the necessary duration for each of these basic acquisitions, the combining of the different acquisitions is inconsistent. These distortions are then called inter-acquisitions, and cause artefacts of the fuzzy type or ghosts in the reconstructed image.

Solutions are known from the state of the art which are based on the data from external sensors, such as respiratory belts or electrocardiogram (ECG), so as to introduce a priori motion data in MRI acquisition and reconstruction processes. These sensors in fact provide valuable information, available over the whole of the MRI examination, and are already used in clinical practice for patient monitoring (cardiac rhythm, apnea monitoring, etc.) and also for cardiac gating (detecting the R waves of the ECG).

A first solution for dealing with the appearance of artefacts in an MRI image during the reconstruction of motion-corrupted data consists simply of deleting the data corrupted by the motion. The thus-subsampled set of data can be reconstructed using parallel imaging. This method is applicable only when there is a small number of said corrupted data.

A second solution consists of verifying the quality of the data during the acquisition, for example by using navigator echoes, and of repeating the acquisition until a set of correct data is obtained. This method substantially increases the length of the acquisition process.

A third solution consists of correcting, rather than rejecting, the corrupted data. Several generalized reconstruction methods are thus known from the state of the art, in which the spatial encoding sequence is modelled by a set of linear operators. The formulation in [Batchelor et al., 2005, "Matrix description of general motion correction applied to multishot images", Magn Reson Med, 54(5), 1273-1280] describes a spatial encoding sequence comprising arbitrary motion in the field of view during the acquisition. The formulation in [Pruessmann et al., 2001, "Advances in Sensitivity Encoding with Arbitrary k-Space Trajectories"] describes a spatial encoding sequence comprising multi-antenna acquisition (the theory of parallel imaging). These two formulations can be combined in a process of acquisition with motion, which is then written in the form of an inverted linear equation. The inversion is theoretically possible provided that the MRI signal is kept in the field of view during the acquisition. Practical realization of the generalized reconstruction in requires a priori knowledge of the motion.

The solution described in the U.S. Pat. No. 6,341,179 is aimed at a reconstruction method for reducing artefacts in physiological images. The technique described is completely automatic, and does not require information other than the set of raw data. The motion occurring during the acquisition is described by a small number of parameters (translations, rotations, etc. at each acquisition time). The invention then consists of seeking these parameters by optimizing a cost function quantifying the quality of the reconstructed image. Shannon's entropy is proposed for this, as the presence of artefacts increases the dispersion of the signal, and therefore the entropy of the image.

The main drawback of this solution is the number of parameters which should be chosen in order to describe the motion. The results are demonstrated in neurological imaging only, with correction of rigid, therefore non-complex, motion of the head. A more precise description of the motion than that of simple rotations and translations would require a very large number of parameters. The choice of a criterion such as entropy leads to the solution of a non-linear problem that is difficult to optimize, in particular in a large dimensional space.

U.S. Pat. No. 7,030,609 also proposes a reconstruction method based on particular acquisition diagram of the k-space. k-space is a mathematical representation tool that is well-known in MRI. It corresponds to the reciprocal space of the image space, of the Fourier space type, in which the experimental data serving to reconstruct the image are collected. According to the U.S. Pat. No. 7,030,609, the acquisition is performed according to a data rectangle passing through the centre of the k-space, called a blade, to which a rotation is applied over time. In this configuration, the central data of the k-space are acquired at each blade. This makes it possible to reconstruct a low-resolution image corresponding to each acquisition time. It is assumed that motion is negligible during the acquisition of a blade. The invention proposes to seek translations and rotations parameters which make it possible to recalibrate the low-resolution images constituted in this way. The parameters found are then used to correct the whole of the set of raw data. This is possible because the affine transformations (such as the overall translations and rotations) forming in the image field are equivalent to affine transformations in the spectral range (in the k-space). The technique is therefore intrinsically limited to affine transformations.

This solution has the drawback of not allowing a freedom of rotation of the slice, because of the rotation of the frequency and phase directions during the sequence. As the field of view represents the bandwidth of the acquisition of the k-space, a signal outside of the field of view will therefore be outside of the acquisition bandwidth. Shannon's theorem is thus invalidated, and the image will be folded.

The publication [Batchelor et al., 2005, "Matrix description of general motion correction applied to multishot images", Magn Reson Med, 54(5), 1273-1280] discloses a reconstruction method in the case of an "arbitrary" motion. By assuming that the fields of movements are known, it is possible to re-write the problem of MRI acquisition with motion using a matrix formalism. In this discrete formulation, all of the operators involved are linear. The initial object undergoes deformations which can be modelled, at a moment of acquisition, by a spatial transformation operator. The object is then spatially encoded (using the gradient system), so as to carry out the acquisition in Fourier space. Only some of the data are acquired at each acquisition, which can be represented by a trajectory operator across the k-space.

The main problem of such a solution is that it requires a priori knowledge of the spatial transformation matrices, i.e. of the motion.

Finally, the publication [Bammer et al., 2007, "Augmented Generalized SENSE Reconstruction to Correct for Rigid Body Motion", Magn. Reson. Med., 57(1), 90-102] relates to a reconstruction method reformulated from another angle. As has been mentioned, affine transformations are changed into affine transformations during a Fourier transform. Assuming that the imaged object undergoes such transformations, and that the k-space trajectory for acquisition is fixed, this is equivalent to regarding the object as fixed and the acquisition trajectory as deformed.

The drawback of such a solution is that this property is true only for affine transformations; the method is therefore limited to affine transformations.

The following documents are also known, but they also fail to provide completely satisfactory solutions to the problem of reconstructing MRI images from motion-corrupted data:

the document US 2007/0182411 A1 by Bammer et al., which describes an algorithm for correcting motion-induced MRI phase errors based on the conjugate gradient;

the document U.S. Pat. No. 4,701,706 by Haacke et al., which describes a generalized reconstruction algorithm which is aimed at correcting MRI sampling errors due to motion and other sources of distortions;

the document "Maximum Cross-Entropy Generalized Series reconstruction" by Hess et al., International Journal of Imaging System and Technology, 10:258-265, 1999, which describes an algorithm making it possible to improve the reconstruction of images from limited sets of data in Fourier space;

the document "Computerized Tomographic Imaging of Time-varying Objects using Mixture models" by Deming et al., IEEE conference CIMSA 2005, pp. 322-327, 2005, which describes a method for reconstructing tomography (CT) images of time-varying objects;

the document "Motion artifact reduction in MRI through generalized DFT" by Knutsson H. et al., IEEE International Symposium on Biomedical Imaging: Macro to Nano, pp. 896-899, 2004, which describes a method making it possible to reduce the artefacts caused by the motion of patients, such as respiration, in MRI imaging.

Thus, the solutions proposed in the state of the art are limited in the number of motion-corrupted data, the type of applicable transformations, as well as the number of degrees of freedom, thus making this type of method inapplicable for complex (for example non-affine) motion. Moreover, the solution is limited by the need for a priori knowledge of the motion.

SUBJECT OF THE INVENTION

The aim of the present invention is to overcome the drawbacks of the state of the prior art, by proposing a means of reconstructing a signal, for example an image, and of determining a model of the acquisition chain, for example of the subject in the MRI system, including acquisition distortions, such as physiological motion, directly from corrupted experimental data.

In the presence of sources of distortion of the problem of reconstructing a signal from experimental data, for example in the presence of elastic physiological motion, the invention makes it possible to reduce the effect of these distortions on the reconstruction of the signal. To this end, the invention proposes a model of the distortions, for example a parametric model describing the elastic physiological motion based on experimental data from motion sensors, constructed so as to include the distortions in the problem of reconstructing the signal. The parametric model describing the distortions is then coupled, according to the invention, to a parametric model simulating the distortion-free signal to be reconstructed. These are two models that the invention proposes to optimize in a coupled manner.

For this purpose, the present invention proposes a method for acquiring distorted experimental measurements of a physical phenomenon and for reconstructing a signal representing this physical phenomenon, implementing:

at least one acquisition chain of said experimental measurements, called measurements of primary interest, said acquisition chain containing at least one distortion, at least one model simulating said acquisition chain, said simulation model receiving a reconstructed signal as input and providing simulated experimental data as output, and at least one distortion model of said distortion of said acquisition chain, said distortion model being determined at least from the experimental measurements themselves, characterized in that said simulation and distortion models comprise adjustable parameters dependent on the experimental measurements, said simulation and distortion models are coupled in the sense that the simulation model depends on at least one adjustable parameter of the distortion model, and said adjustable parameters are optimized jointly, said optimization providing, the signal and the parameters of the distortion model as output.

The method according to the invention can moreover implement means allowing experimental measurements to be acquired to supplement said measurements of primary interest.

According to particular embodiments, the optimization of said adjustable parameters of the simulation and distortion models can be carried out using a cost function quantifying the level of distortion of the signal and the adjustable parameters of said models;

the optimization of said adjustable parameters of the simulation and distortion models can be carried out using a cost function quantifying the discrepancy between at least a part of the signal from the experimental measurements and at least a part of the corresponding signal reconstructed by means of at least one simulation model;

the optimization of said adjustable parameters of the simulation and distortion models can include at least a step of minimizing a reconstruction residual defined as the discrepancy between at least a part of the signal from the experimental measurements and at least a part of the corresponding signal reconstructed by at least one simulation model;

said simulation model can be produced in the form of a linear operator;

the optimization of said parameters of the simulation model can be carried out by solving the inverse problem of the simulation model, taking the experimental measurements as inputs and solving the equivalent Hermitian symmetry problem;

the solution of said inverse problem of the simulation model can be carried out using an iterative method that does not require explicit knowledge of the complete Hermitian operator, such as the conjugate gradient, the generalized minimal residual (GMRES) or the biconjugate gradient;

the solution of said inverse problem of the simulation model can comprise at least one regularization such as a Tikhonov regularization;

the signal from the solution of the inverse problem of the simulation model can be used to generate the result of the simulation model, the difference between said experimental measurements of primary interest and said result of the simulation model being used as the optimization criterion for said coupled simulation and distortion models, and a reconstruction residual being calculated from the difference between experimental measurements of primary interest and said result of the simulation model;

said reconstruction residual can be modelled by a residual operator, said residual operator taking an estimate of the errors made on the parameters of the distortion model as input and providing said reconstruction residual as output, and being a function of the current parameters of the simulation and distortion models;

said residual operator can comprise linear operators appearing in the simulation operator, and a composite of the gradient of the current signal and the supplementary experimental measurement data;

said residual operator can be linear for minor errors on the parameters of said distortion model;

the optimization of the parameters of the distortion model can be carried out by solving the inverse problem described by said residual operator, said solution of the inverse problem being carried out by solving the equivalent Hermitian symmetry problem, said estimate of the errors made on the parameters of the distortion model being used to update the parameters of the distortion model;

said solution of the inverse problem described by the residual operator can be carried out using an iterative method that does not require explicit knowledge of the complete Hermitian operator, such as the conjugate gradient, the generalized minimal residual (GMRES) or the biconjugate gradient;

said solution of the inverse problem described by the residual operator can comprise a regularization of one of the following types: Tikhonov regularization involving the parameters of the distortion model plus the errors on the parameters of said distortion model, constrain involving the square of the norm of the spatial gradient of the parameters of the distortion model plus the errors on the parameters of said distortion model;

the optimization of said parameters of said simulation and distortion models can be carried out using a fixed-point method, each model being optimized separately, all of the others being regarded as fixed, and said optimization being carried out alternately on each model;

said optimization of the parameters of the simulation and distortion models can be repeated according to a primary iteration, the optimal parameters being those that result in the least residual, and said primary iteration being governed by a stop condition which is established by any one of the following criteria: the difference between said residuals during two separate incrementations of the primary iteration, a predetermined minimum value of said residual, or a predetermined number of iterations;

said optimization of the parameters of the simulation and distortion models can be repeated according to a secondary multi-resolution iteration established on the basis of a level of resolution of the signal;

the parameters of the simulation and distortion models can be initialized in advance at least from one of the elements among the acquisitions of experimental measurements, and constant values;

the simulation model can be produced in the form of a linear operator comprising: a spatial transformation operator modelled by said distortion model, an antenna sensitivity weighting operator, an encoding operator, and a Cartesian grid sampling operator;

said spatial transformation operator can be an elastic spatial transformation operator making it possible to take locally free deformations into account;

said spatial transformation operator can be modelled by at least one motion-distortion model, said motion distorting the experimental measurements of primary interest, said motion-distortion model capable of being broken down into a set of parameters describing the spatial dependence of the model and at least one item of information correlated to the motion at different acquisition times of the experimental measurements, said motion-distortion model being linear, modelling the temporal course of the parameters describing the motion by linear combinations of signals from said supplementary experimental measurements;

said supplementary experimental measurements can be used to restrict the motion-distortion model;

said antenna sensitivity weighting operator can be modelled by at least one sensitivity-distortion model, said sensitivity-distortion model capable of being broken down into a set of parameters describing at least one antenna sensitivity map;

the residual operator can be written in the same manner as the simulation operator, replacing said antenna sensitivity weighting operator with a diagonal operator, the diagonal of which is constituted by the resultant of the composition of the current signal by a spatial transformation operator;

said encoding operator can be an operator of the Fourier transform type.

According to a preferred embodiment, the method according to the invention can comprise a step of acquiring the data and preparing the reconstruction, said step comprising:

the acquisition of experimental measurements of primary interest and supplementary experimental measurements, said supplementary experimental measurements originating at least from one of the following: an external sensor, a navigator echo, and experimental measurements of primary interest, the synchronization of the events relating to the acquisition of the experimental measurements of primary interest and the acquisition of the supplementary experimental measurements, such as the acquisition times and the order of acquisition of the data.

According to particular embodiments, the preparation of the reconstruction can comprise a sorting operation for the experimental measurements of primary interest to which similar constraints are applied, said similar constraints being based on data of similar supplementary experimental measurements, said sorting operation producing at least one sorted supplementary experimental datum and at least one set of indices of interest describing said sorting of the experimental measurement data of primary interest, said experimental measurements of primary interest being combined into at least one set corresponding to said set of indices of interest.

at least one set of indices of interest can be determined by operating a quantification of the variation space of the supplementary experimental measurements;

said preparation of the reconstruction can comprise at least one pre-transform of the experimental measurements of primary interest, such as a Fourier transform in the direction(s) independent of the distortion caused by motion;

the operator of at least one of the simulation and distortion models can be broken down into at least one sub-element indexed by said indices of interest, said experimental acquisitions of primary interest combined into indexed sets being the distorted experimental data to be reconstructed. Said data from the supplementary experimental measurements sorted according to said indices of interest being the supplementary experimental data used to restrict said motion-distortion model;

the calculation of said indexed sub-elements of said operators can be parallelized on separate computers;

The method according to the invention can moreover comprise adjustable acquisition parameters, said adjustable acquisition parameters being taken into account by the simulation and distortion models, said adjustable acquisition parameters being a function of the parameters of the optimized distortion models, said adjustable acquisition parameters being updated once the optimal parameters of said simulation and distortion models have been established, said updating of said adjustable acquisition parameters being repeated according to an iteration governed by a stop condition.

According to particular embodiments, said adjustable acquisition parameters can be affine transformation parameters of an MRI acquisition volume, and said updating of said adjustable acquisition parameters can be an affine transformation model of an MRI acquisition volume dependent in real time on the supplementary experimental measurements.

According to further particular embodiments of the method according to the invention, said signal can be reconstructed in a form chosen from a voxel, an image, a stack of images and an MRI volume;

said signal can be reconstructed in the form of at least one spectrum of at least one NMR spectroscopy voxel.

said signal can be reconstructed in a form chosen from a voxel, an image, a stack of images and a volume from a medical images acquisition process chosen from X-ray tomography, positron emission tomography, single photon emission tomography and ultrasonography.

In a variant, the invention proposes a method for acquiring experimental measurements distorted by a physical phenomenon and for reconstructing a point signal representing this physical phenomenon, in at least one dimension, capable of varying during the acquisition of the experimental measurements, using at least one model simulating at least one acquisition chain of these experimental measurements comprising at least one distortion, and at least one model of each distortion of each acquisition chain, each distortion model being determined at least from the measurements themselves, characterized in that the simulation and distortion models comprise adjustable parameters dependent on the experimental conditions, at least one adjustable parameter of one of said models being coupled to at least one adjustable parameter of the other model, and in that these adjustable parameters are optimized in a coupled manner.

According to particular embodiments the coupled optimization of said adjustable parameters of said simulation and distortion models is carried out using a cost function quantifying the level of distortion of the signal and/or the adjustable parameters of said models;

the coupled optimization of said parameters of said simulation and distortion models is carried out using a cost function quantifying the discrepancy between at least a part of the signal from the experimental measurements and at least a part of the corresponding signal reconstructed by at least one simulation model.

the coupled optimization of said parameters of said simulation and distortion models comprises at least one step of minimizing a reconstruction residual defined as the discrepancy between at least a part of the signal from the experimental measurements and at least a part of the corresponding signal reconstructed by at least one simulation model.

the optimization of said parameters of said simulation model is carried out using an inverse problem solution method, taking the experimental measurements as inputs and solving the inverse problem thereof by Hermitian symmetry.

the optimization of said parameters of said simulation model is carried out using an inverse problem solution method, taking the experimental measurements as inputs and solving the inverse problem thereof by an iterative Krylov method, chosen from the conjugate gradient, the generalized minimal residual (GMRES) and the biconjugate gradient.

the optimization of said parameters of said simulation model is carried out using an inverse problem solution method, taking the experimental measurements as inputs and solving the inverse problem thereof using at least one regularization method.

at least one regularization method is a Tikhonov regularization method.

at least one regularization method is a total variation restriction method.

at least one regularization method is a method of regularization established by the spatial gradient of said parameters of the distortion model and by the reconstruction residual of the distortion model.

the optimization of the parameters of at least one of the distortion models is carried out using an inverse problem solution method, taking the reconstruction residual obtained during the optimization of said parameters of said simulation model as input.

said coupled optimization of said parameters of said simulation and distortion models is repeated according to a primary iteration of the optimization of the parameters, governed by a stop condition.

the stop condition is established by the difference between said difference residuals during two separate incrementations of the primary iteration of the optimization of the parameters.

said two separate incrementations are the last and penultimate incrementations of the primary iteration of the carried-out optimization of the parameters.

said stop condition is established by a predetermined number of iterations.

said stop condition is established by a predetermined minimum value of the residual.

said coupled optimization of said parameters of said simulation and distortion models is repeated according to a secondary multi-resolution iteration, established on the basis of a level of resolution of the signal to be reconstructed;

the initial level of resolution is derived from data from experimental measurements originating from at least one external sensor or predetermined information.

the incrementation of the level of resolution is carried out by doubling said level of resolution.

at least one simulation model is a simulation operator which applies to a signal, this operator breaking down into a combination of at least one operator chosen from a spatial transformation operator, a radio-frequency reception antenna sensitivity operator, an encoding operator and a sampling operator.

the behaviour of the simulation operator of at least one simulation model is linear.

the behaviour of the spatial transformation of at least one spatial transformation operator is affine.

the behaviour of the spatial transformation of at least one spatial transformation operator is elastic.

at least one encoding operator is an operator of the Fourier transform type.

the Fourier transform of at least one encoding operator of the Fourier transform type is implemented by a fast Fourier transformation chosen from an FFT and an FFTW.

at least one encoding operator is a projection operator.

at least one sampling operator is a Cartesian grid sampling operator.

at least one sampling operator is a non-Cartesian sampling operator, re-sampling the simulation data previously produced on a Cartesian grid.

the parameters of said simulation and distortion models are initialized in advance by acquisitions of experimental measurements.

the method integrates, in a synchronized manner, at least one signal correlated to the variation of the cause of the distortion over time and originating from at least one external sensor.

at least one external sensor is of the navigator echo type.

the method incorporates a data-preparation module, also operating a real-time sorting, of the set of experimental measurements according to the indices of interest determined by quantifying the variation space of the experimental measurement data.

the experimental measurements the index of interest of which is greater than a predetermined threshold value are pre-transformed according to a Fourier transform in at least one direction independent of the distortion.

said signal is reconstructed in a form chosen from a voxel, an image, a stack of images and an MRI volume;

the affine transformation parameters of the MRI acquisition volume depend, in real time, on the experimental measurements.

said signal is reconstructed in the form of a spectrum of an NMR spectroscopy voxel.

said signal is reconstructed in a form chosen from a voxel, an image, a stack of images and a volume, from a medical images acquisition process chosen from X-ray tomography, positron emission tomography, single photon emission tomography and ultrasonography.

The invention also relates to an MRI imaging device, comprising means of acquiring and processing MRI images, implementing such an acquisition and reconstruction process for the correction of distortions that is applied to a signal reconstructed in a form chosen from a voxel, an image, a stack of images and an MRI volume.

The invention also relates to an NMR spectroscopy device, comprising means of acquiring and processing NMR spectra, implementing such an acquisition and reconstruction process for the correction of distortions that is applied to a signal reconstructed in the form of a spectrum of an NMR spectroscopy voxel.

Finally, the invention relates to a medical imaging device, comprising means of acquiring and processing images, implementing such a method of acquisition and reconstruction for the correction of distortions applied to a signal reconstructed in a form chosen from a voxel, an image, a stack of images and a volume from a process of acquiring medical images chosen from X-ray tomography, positron emission tomography, single photon emission tomography and ultrasonography.

BRIEF DESCRIPTION OF THE DRAWINGS

The invention will be better understood on reading the detailed description of a non-limiting embodiment example, accompanied by figures showing, respectively.

DETAILED DESCRIPTION OF PARTICULAR EMBODIMENTS

Figure 1:
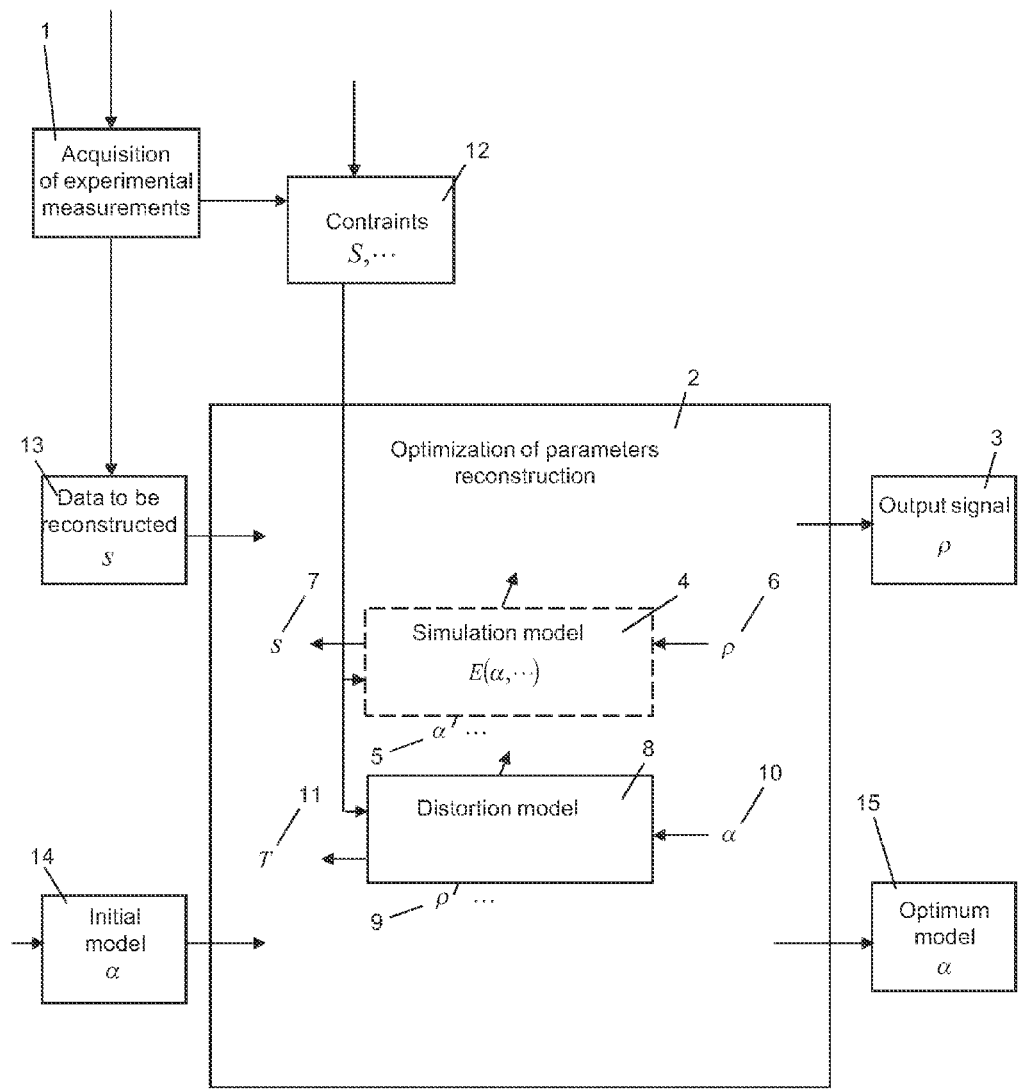
FIG. 1, a generalized reconstruction method using inversion of coupled systems (GRICS) with coupled simulation and distortion models, in accordance with the present invention, FIG. 2, a generalized reconstruction method using inversion of coupled systems with coupled simulation and distortion models, using a cost function, FIG. 3, a detailed simulation model of an acquisition chain, in accordance with the present invention, FIG. 4, a method of generalized reconstruction by inversion of coupled systems with coupled simulation and distortion models, using an optimization by minimization of the residual and a preparation of the reconstruction, FIG. 5, a method of generalized reconstruction by inversion of coupled multi-model distortion and multi-resolution systems, FIG. 6, a method of generalized reconstruction by inversion of coupled multi-model and dynamic systems, and FIG. 7, a method of generalized reconstruction by inversion of coupled iterative multi-resolution systems with a single model.

FIG. 1 represents a generalized reconstruction method using inversion of coupled systems (GRICS) with coupled simulation and distortion models, in accordance with the present invention.

A method for acquiring distorted experimental measurements and for reconstructing a point, mono- or multi-dimensional signal which may vary during the acquisition of the experimental measurements, in accordance with the present invention, can be illustrated by a method of parallel MRI acquisition (1) distorted by a motion of the imaged subject and the reconstruction (2) of a stack of images ρ (3) illustrated in FIG. 1.

It is understood that this illustration is particular embodiment of the invention, and that any other type of generalized reconstruction by inversion of coupled systems (GRICS) would be possible.

This method is also illustrated by an NMR spectroscopy acquisition of the CSI (chemical shift imaging) type or by a tomographic acquisition such as scanning or PET (positron emission tomography), these acquisitions being distorted by a motion.

This method uses a simulation model (4) of the motion-disturbed MRI acquisition chain dependent on the parameters (5) of the motion-disturbed distortion model. This simulation model takes the stack of images ρ (6) as input and delivers simulated experimental data s (7) as output. This method uses a motion-distortion model (8) that depends on the parameters of the simulation model, the image ρ (9). This motion-distortion model takes the parameters α (10) as inputs and delivers a spatial transformation operator T (11) as output. Information S derived from the experimental measurements and/or experimental data correlated with the cause of the motion, such as for example navigator echoes, partial MRI images or data from physiological sensors, such as the signal from a respiratory belt or the derivative of this signal, are used as constraints (12) in the simulation (4) and distortion (8) models. The optimization of the parameters α and ρ is initialized using the distorted experimental measurements s (13) of initial parameters α (14), which have either come from previous results or are initialized to a constant value which can be zero. The optimization delivers the image ρ (3) and optimal parameters α (15) of the motion-distortion model as output.

Figure 2:
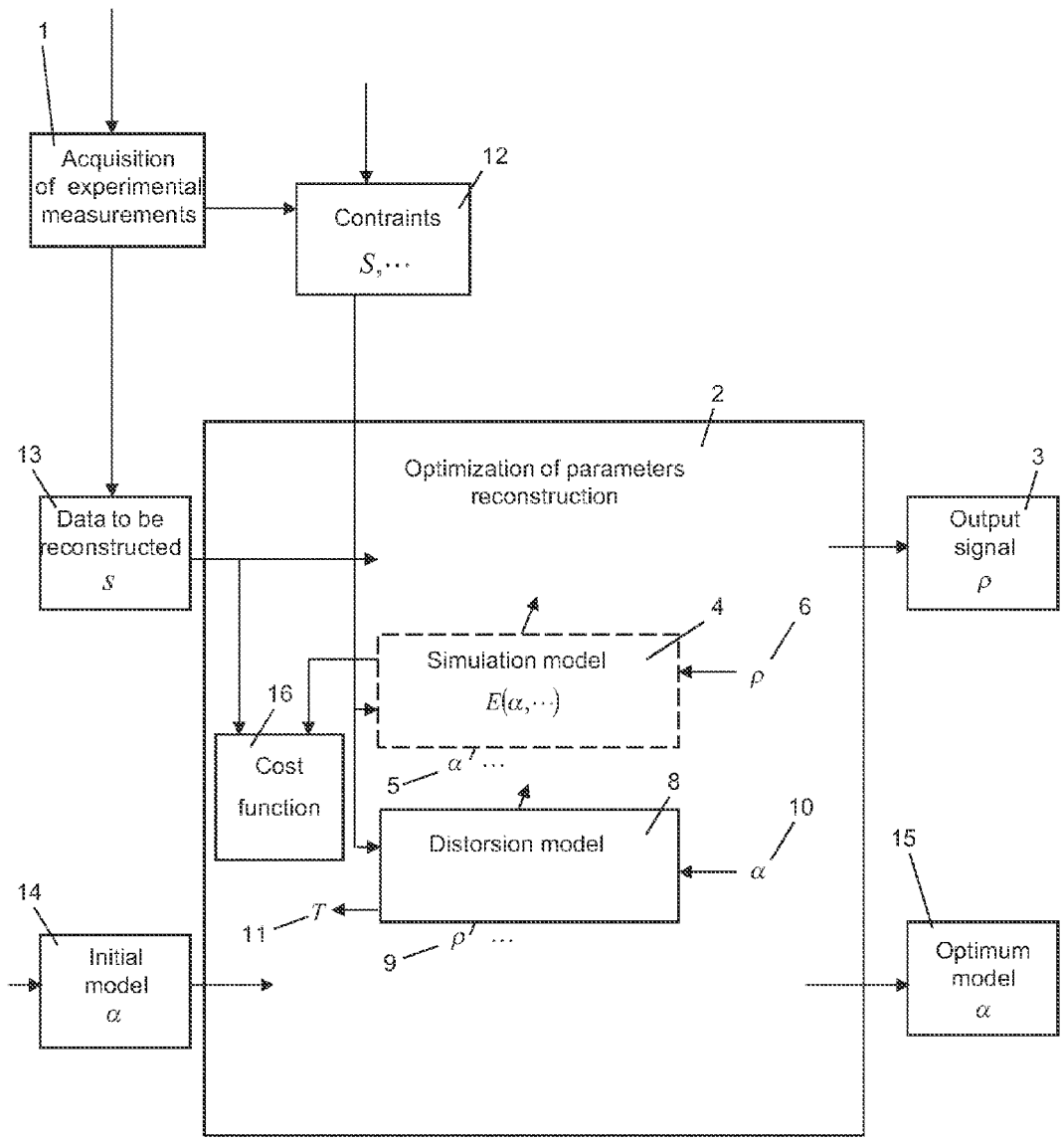

FIG. 2 represents a method of generalized reconstruction by inversion of coupled systems with coupled simulation and distortion models, using a cost function, in accordance with the present invention.

A method of generalized reconstruction by inversion of coupled systems with coupled simulation and distortion models in accordance with the present invention can be illustrated by the method of parallel MRI acquisition (1) distorted by a motion of the imaged subject and the reconstruction (2) of an image ρ already described above in points (1) to (15). The optimization (2) includes a cost function (16) which is either a function qualifying the quality of the signal, such as the entropy of the image, or a function quantifying the adequacy between the distorted experimental measurements s (13) and the simulated experimental data s (7), such as the difference between these two terms.

Figure 3:
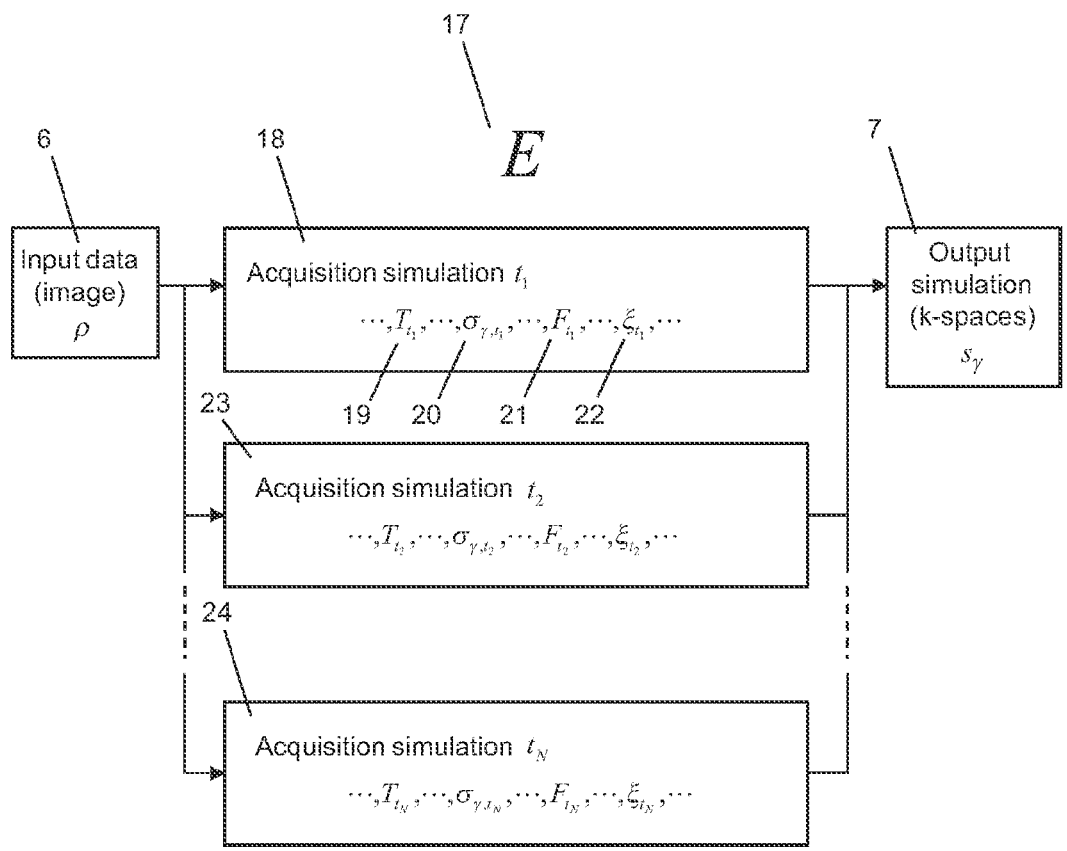

FIG. 3 represents a detailed simulation model of a acquisition chain (4), in accordance with the present invention, The present example relates to three-dimensional MRI images.

This method uses a simulation model for the motion-distorted MRI acquisition chain illustrated in FIG. 3, which incorporates the elements (4), (6) and (7) described above when explaining part (4). The simulation model for the acquisition chain is produced in the form of a linear operator E (17) which links the image ρ (6) measuring $N_x \times N_y \times N_z$ (numbers of voxels in the 3 spatial dimensions) with the simulated experimental data measuring $N_x \times N_y \times N_z \times N_\gamma \times N_R \times N_{NEX}$ ($N_\gamma$ number of antennae, $N_R$ parallel MRI reduction factor, $N_{NEX}$ number of excitations in the experimental acquisition). The typical sizes that can be expected for the measurements of the operator E are $N_x \times N_y \times N_z = 256 \times 256 \times 32$, $N_\gamma = 8$, $N_R = 1$ and $N_{NEX} = 4$.

The operator E is broken down into one or more sub-elements (18), (23) to (24) which each simulate the MRI acquisition in a group of physiological positions that are close enough not to distort the MRI acquisition. Typically, the number of sub-elements used to carry out the method illustrating the invention is 8. The sub-elements are indexed by an index $t_i$, which represents the dummy acquisition time of a group of physiological positions that are close enough.

The sub-elements of the operator E comprise:

a spatial transformation operator $T_{t_i}$ (19) with an index $t_i$, interpolation operator which is represented by a sparse matrix measuring $N_x N_y N_z \times N_x N_y N_z$ representing the shift from $t_0$ to $t_i$. The number of non-zero elements of the operator $T_{t_i}$ depends on the chosen interpolation basis (linear, cubic, sinc with Kaiser-Bessel window, etc.). The operator $T_{t_i}$ is chosen as an arbitrary spatial transformation (making it possible to take locally free deformations into account), the restriction to an affine transformation is also possible in another embodiment.

an antenna sensitivity weighting operator $\sigma_\gamma$ (20) for the antenna γ, diagonal matrix measuring $N_x N_y N_z \times N_x N_y N_z$, a Fourier transform operator F (21) in three dimensions, measuring $N_x N_y N_z \times N_x N_y N_z$; according to a particular embodiment, the operator (21) is a projection operator for creating the sinograms needed for the simulation of the tomography acquisition using X-rays, PET or SPECT (single-photon emission computed tomography) for example, and a sampling operator $\xi_{t_i}$ (22) with an index $t_i$, a sparse matrix measuring $N_{k\text{-}acquisition\ point\ t_i} \times N_x N_y N_z$ which assumes the values 0 or 1 for a Cartesian sampling. In another embodiment, the sampling can be chosen as non-Cartesian, the sampling operator will then be the inverse of the Cartesian grid resampling operator.

The simulation model (4) is then written in the following manner:

$$s = E\rho \quad \text{(Eq. 1)}$$

The operator is then written by stacking the acquisitions of the different antennae in the following manner:

$$E = \begin{bmatrix} \xi_{t_1} F \sigma_1 T_{t_1} \\ \vdots \\ \xi_{t_N} F \sigma_1 T_{t_N} \\ \vdots \\ \xi_{t_1} F \sigma_{N_\gamma} T_{t_1} \\ \vdots \\ \xi_{t_N} F \sigma_{N_\gamma} T_{t_N} \end{bmatrix}, \quad \text{(Eq. 2)}$$

The implementation of the Fourier operator is carried out by discrete fast Fourier transform using the "Fastest Fourier Transform in the West" (FFTW) algorithm.

The optimization of the signal ρ is carried out by the solution of the inverse problem of the equation (Eq. 1), more particularly using the formulation of the Hermitian symmetry problem which is written in the following manner:

$$E^H s = E^H E \rho, \quad \text{(Eq. 3)}$$
with $$E^H E = \sum_{n=1}^{N} T_{t_n}^H \left( \sum_{\gamma=1}^{N_\gamma} \sigma_\gamma^H F^H \xi_{t_n}^H \xi_{t_n} F \sigma_\gamma \right) T_{t_n}. \quad \text{(Eq. 4)}$$

The equation (Eq. 3) is solved using an iterative algorithm which does not require explicit knowledge of the operator $E^H E$ such as the conjugate gradient method or the generalized minimal residual (GMRES) method. Such algorithms only require knowledge of the function $x \mapsto E^H E x$ which can be calculated by cascading the different operators in the sum of the equation (Eq. 4). This makes it possible to limit the RAM (Random Access Memory) requirement in the implementation and makes it possible to use the fast Fourier transform algorithm. The conditioning of the operator $E^H E$ can be enhanced by increasing the number of independent acquisitions $N_{NEX}$. A Tikhonov regularization is used to solve the inverse problem, the operator $E^H E$ being replaced by $E^H E + \lambda \mathrm{Id}$, Id being the identity matrix. A typical value for λ is λ=0.01.

Figure 4:
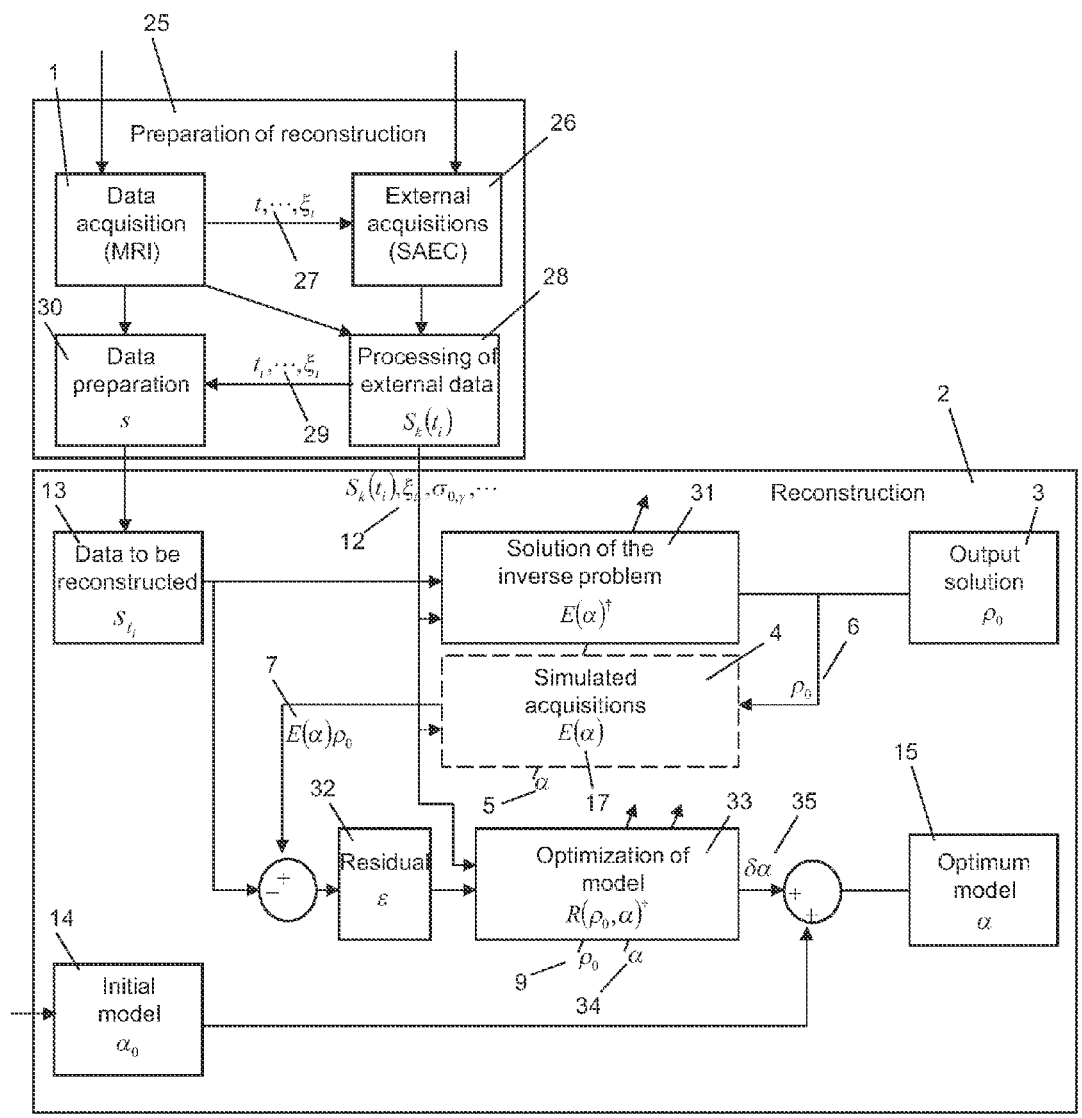

FIG. 4 represents a method of generalized reconstruction by inversion of coupled systems with coupled simulation and distortion models, using an optimization by minimizing the residual and a preparation of the reconstruction, in accordance with the present invention.

A method of generalized reconstruction by inversion of coupled systems illustrated in FIG. 4, incorporates the elements disclosed above, in particular the elements (1) to (5), (7), (9), (12) to (15) and (17).

The method comprises a part of acquiring and preparing the reconstruction (25). In order to carry out this preparation, the acquisition includes a device making it possible to acquire external measurements (26), named a "Signal Analyzer and Event Controller" (SAEC), which makes it possible to acquire physiological signals, such as the variation in pressure of several pneumatic belts and such as several ECG derivations. The SAEC also records the MRI acquisition windows and the variation in the magnetic field gradients of the MRI sequences, which makes it possible to match the events relating to the MRI acquisition (27) (in particular the measurements times and the order of acquisition of k-space data) to the physiological acquisitions.

The SAEC (Signal Analyzer and Event Controller) is a platform for acquisition and real-time processing of the physiological data.

The method comprises a module processing external data (28), which receives everything that the SAEC records. According to another embodiment, the module processing external data receives the data derived from MRI navigator echoes or partial images formed from a part of the MRI acquisition, which are correlated to the physiological motion (respiration or heart beat). The module processing external data operates a quantification of the signals from the respiratory belts and their derivatives, that is the $S_k(t_i)$. This quantification makes it possible to combine the MRI acquisitions into groups of points in the k-space having the same quantified physiological acquisitions, groups described by the operators $\xi_{t_i}$. The quantification index is $t_i$. These values are transmitted (29) to the data-preparation module (30).

The method comprises a data-preparation module (30) which receives the distorted experimental data from the MRI system (1). It combines the data linked by a single quantification index $t_i$. It also carries out the Fourier transformations in the directions independent of the distortion caused by motion, reducing the size of the problem accordingly. It delivers the experimental data to be reconstructed (13) as output.

The spatial transformation operators $T_{t_i}$ are determined from a motion-distortion model. This model makes it possible to reduce the number of parameters describing the motion in a significant manner, while still authorizing locally free spatial deformations. Thus the temporal evolution of each voxel is expressed as a linear combination of the signals $S_k(t_i)$ correlated with the motion. Such input signals can be navigator echoes or external sensors, such as respiratory belts and ECGs, or signals derived therefrom. The motion-distortion model is described by a field of movement u(r,t) at the position $r=[x,y,z]^T$ and at time t, this model can describe elastic motion by the following linear combination:

$$u(r, t) = \sum_{k=1}^{K} S_k(t) \cdot \alpha_k(r) \quad \text{(Eq. 5)}$$

The coefficients maps $\alpha_k(r) = [\alpha_{k,x}(r) | \alpha_{k,y}(r) | \alpha_{k,z}(r)]^T$ describe the distortion model. A coefficients map is defined for each signal and each spatial dimension.

Motion is thus represented by a linear combination, the variation of which over time depends on the "external" signals correlated with the variation of the motion over time, which is multiplied by a coefficients matrix α, for each voxel of the image and for each direction of the space.

It is understood that this linear modelling is a particular embodiment of the invention, and that any other type of modelling is equally possible.

Furthermore, other distortions can be envisaged, such as a modelling of the errors made on the antennae sensitivity maps. In the embodiment presented, it is chosen to represent the sensitivity maps by a model that does not vary over time. The model is then reduced to a set of sensitivity maps varying only in space which is written in the form of a diagonal matrix operator: $\sigma_\gamma$ (measuring $N_x N_y N_z \times N_x N_y N_z$)

The solution of the inverse problem of the simulation model (31) depends on the parameters of the motion-distortion model (5). It is solved by an iterative method iterative of the GMRES type.

The image $\rho_0$ (6) from the solution of the inverse problem of the simulation model (31) is injected into the simulation model (4) in order to generate simulated raw data $E(\alpha)\rho_0$ (7)

The residual $\epsilon$ is calculated (32) from the difference between the experimental measurements (13) and the results of the simulation (7), it is expressed as follows:

$$\epsilon = s - E\rho_0 \qquad \text{(Eq. 6)}$$

The method includes a residual operator R dependent on the parameters of the simulation model $\rho$ (9) and the parameters of the motion-distortion model $\alpha$ (34), which combines a small variation in the parameters of the motion-distortion model $\delta\alpha$ (35) with the residue $\epsilon$ (32). This operator is linear.

Using the storage of the MRI signal, it is possible to write:

$$\frac{d\rho}{dt} = 0 \Rightarrow \frac{\partial \rho}{\partial t} + \frac{\partial \rho}{\partial r} \cdot \frac{\partial r}{\partial t} \Rightarrow \frac{\partial \rho}{\partial t} = -\frac{\partial \rho}{\partial r} \cdot \frac{\partial r}{\partial t} = -\nabla_r \rho \cdot \frac{\partial r}{\partial t} \qquad \text{(Eq. 7)}$$

A consequence of a small error in the description of the motion $\delta u(r,t)$ is an error in the simulated data.

The MRI experiment is written as the production of raw data from an optimum image $\rho_0$ without distortion (movement):

$$s = F, \rho_0 = \begin{bmatrix} \xi_{t_1} F \sigma_1 T_{t_1} \\ \vdots \\ \xi_{t_N} F \sigma_1 T_{t_N} \\ \vdots \\ \xi_{t_1} F \sigma_{N_\gamma} T_{t_1} \\ \vdots \\ \xi_{t_N} F \sigma_{N_\gamma} T_{t_N} \end{bmatrix} \rho_0. \qquad \text{(Eq. 8)}$$

The MRI experiment is also written as the production of raw data from a set of distorted images (comprising the spatial transformation) $\rho_{t_i}$:

$$s = \begin{bmatrix} \xi_{t_1} F \sigma_1 (T_{t_1} \rho_0) \\ \vdots \\ \xi_{t_N} F \sigma_1 (T_{t_N} \rho_0) \\ \vdots \\ \xi_{t_1} F \sigma_{N_\gamma}(T_{t_1} \rho_0) \\ \vdots \\ \xi_{t_N} F \sigma_{N_\gamma}(T_{t_N} \rho_0) \end{bmatrix} = \begin{bmatrix} \xi_{t_1} F \sigma_1 \rho_{t_1} \\ \vdots \\ \xi_{t_N} F \sigma_1 \rho_{t_N} \\ \vdots \\ \xi_{t_1} F \sigma_{N_\gamma} \rho_{t_1} \\ \vdots \\ \xi_{t_N} F \sigma_{N_\gamma} \rho_{t_N} \end{bmatrix}. \qquad \text{(Eq. 9)}$$

A small error in the description of the motion creates different images $\hat{\rho}_{t_i}$ that can be introduced into the equation (Eq. 9):

$$s = \begin{bmatrix} \xi_{t_1} F \sigma_1 \hat{\rho}_{t_1} \\ \vdots \\ \xi_{t_N} F \sigma_1 \hat{\rho}_{t_N} \\ \vdots \\ \xi_{t_1} F \sigma_{N_\gamma} \hat{\rho}_{t_1} \\ \vdots \\ \xi_{t_N} F \sigma_{N_\gamma} \hat{\rho}_{t_N} \end{bmatrix} + \begin{bmatrix} \xi_{t_1} F \sigma_1 (\rho_{t_1} - \hat{\rho}_{t_1}) \\ \vdots \\ \xi_{t_N} F \sigma_1 (\rho_{t_N} - \hat{\rho}_{t_N}) \\ \vdots \\ \xi_{t_1} F \sigma_{N_\gamma}(\rho_{t_1} - \hat{\rho}_{t_1}) \\ \vdots \\ \xi_{t_N} F \sigma_{N_\gamma}(\rho_{t_N} - \hat{\rho}_{t_N}) \end{bmatrix}. \qquad \text{(Eq. 10)}$$

The equation (Eq. 10) is interpreted as the difference between a simulation comprising a distortion error estimation $\hat{E}$ and the optimum simulation:

$$s = \hat{E}\rho_0 + \epsilon, \qquad \text{(Eq. 11)}$$

It is possible subject to a small error made in the description of the motion, and therefore in the movement fields, to write the difference between images of the equation (Eq. 10):

$$\rho_{t_n} - \hat{\rho}_{t_n} = (-\nabla \hat{\rho}_{t_n})^T \cdot \delta u_{t_n} + 0(\|\delta u_{t_n}\|^2) \qquad \text{(Eq. 11)}$$

The residual is then written:

$$\varepsilon \simeq \begin{bmatrix} \xi_{t_1} F \sigma_1 (-\nabla \hat{\rho}_{t_1})^T \cdot \delta u_{t_1} \\ \vdots \\ \xi_{t_N} F \sigma_1 (-\nabla \hat{\rho}_{t_N})^T \cdot \delta u_{t_N} \\ \vdots \\ \xi_{t_1} F \sigma_{N_\gamma} (-\nabla \hat{\rho}_{t_1}) \cdot \delta u_{t_1} \\ \vdots \\ \xi_{t_N} F \sigma_{N_\gamma} (-\nabla \hat{\rho}_{t_N})^T \cdot \delta u_{t_N} \end{bmatrix}. \qquad \text{(Eq. 12)}$$

Reintroducing the motion-distortion model into the equation (Eq. 12) it is written:

$$\varepsilon = \begin{bmatrix} \xi_{t_1} F \sigma_1 (-\nabla \hat{\rho}_{t_1})^T \cdot \sum_{k=1}^{K} S_k(t_1) \delta \alpha_k \\ \vdots \\ \xi_{t_N} F \sigma_1 (-\nabla \hat{\rho}_{t_N})^T \cdot \sum_{k=1}^{K} S_k(t_N) \delta \alpha_k \\ \vdots \\ \xi_{t_1} F \sigma_{N_\gamma} (-\nabla \hat{\rho}_{t_1})^T \cdot \sum_{k=1}^{K} S_k(t_1) \delta \alpha_k \\ \vdots \\ \xi_{t_N} F \sigma_{N_\gamma} (-\nabla \hat{\rho}_{t_N})^T \cdot \sum_{k=1}^{K} S_k(t_N) \delta \alpha_k \end{bmatrix} = R(\rho_0, \alpha) \delta \alpha. \qquad \text{(Eq 13)}$$

The residual operator $R(\rho_0, \alpha)$ is then written as a function of the same operators included in the simulation operator $E(\alpha)$, to which are added a composite of the spatial gradient of the current signal $(-\nabla \hat{\rho}_{t_i})^T$ and of motion-correlated information $S_k(t_n)$:

$$\varepsilon = R(\rho_0, \alpha)\delta\alpha = \begin{bmatrix} \xi_{t_1} F_{\sigma_1}(-\nabla\hat{\rho}_{t_1})^T \cdot \sum_{k=1}^{K} S_k(t_1) \cdot \delta\alpha_k \\ \vdots \\ \xi_{t_N} F_{\sigma_1}(-\nabla\hat{\rho}_{t_N})^T \cdot \sum_{k=1}^{K} S_k(t_N) \cdot \delta\alpha_k \\ \vdots \\ \xi_{t_1} F_{\sigma_{N_\gamma}}(-\nabla\hat{\rho}_{t_1})^T \cdot \sum_{k=1}^{K} S_k(t_1) \cdot \delta\alpha_k \\ \vdots \\ \xi_{t_N} F_{\sigma_{N_\gamma}}(-\nabla\hat{\rho}_{t_N})^T \cdot \sum_{k=1}^{K} S_k(t_N) \cdot \delta\alpha_k \end{bmatrix} \quad \text{(Eq. 14)}$$

The equation (Eq. 14) shows a linear relationship between a small variation in the parameters of the motion-distortion model $\delta\alpha$ and the residual $\epsilon$.

The optimization of the parameters of the distortion model $\alpha$ is carried out by resolving the inverse problem of the residual operator (33), taking the residual $\epsilon$ as input and obtaining the errors made in the parameters of the distortion model $\delta\alpha$ (35) as the output. Once obtained, these errors $\delta\alpha$ are used in order to update the parameters of the motion-distortion model. In the same way as for the inverse problem (31), solution of the inverse problem is carried out by resolving the equivalent Hermitian symmetry problem using the iterative GMRES method, and a constraint-type adjustment of type on the square of the norm of the spatial gradient of the parameters of the distortion model, plus the errors on the parameters of the distortion model corresponding to the minimization expressed as follows:

$$\delta\alpha^{(k)} = \min_{\delta\alpha}\{\|R(\rho_0^{(k)}, \alpha^{(k)})\delta\alpha - \varepsilon\|^2 + \mu\|\nabla(\alpha^{(k)} + \delta\alpha)\|^2\} \quad \text{(Eq. 15)}$$

A typical value of the regularization parameter is $\mu=0.1\|\epsilon\|$

This method makes it possible to obtain an image solution $\rho_0$ and an optimum model $\alpha$, these last two being obtained by optimization steps. Such a method can be reproduced iteratively, as will be seen below.

Figure 5:
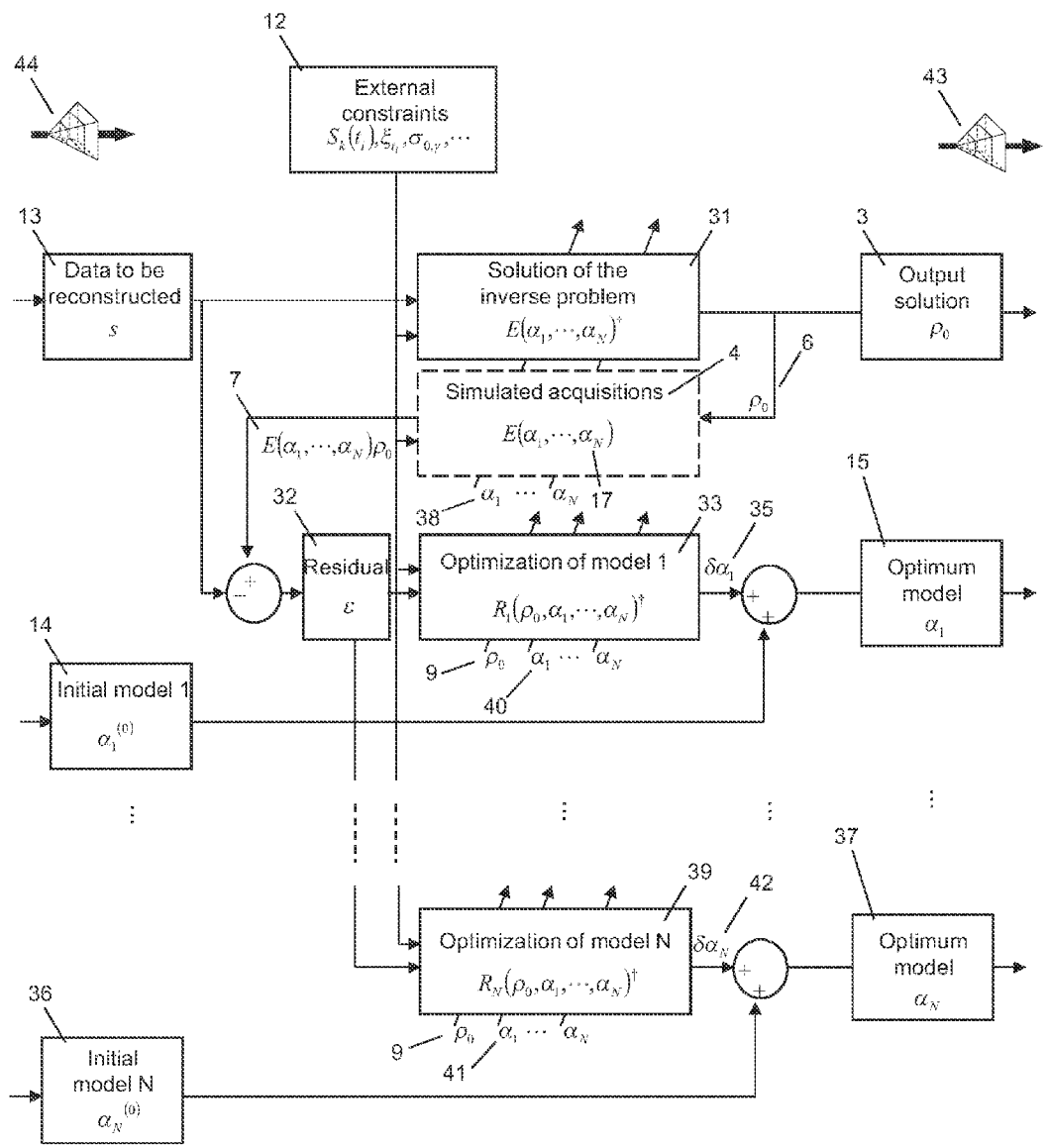

FIG. 5 represents a method of generalized reconstruction by inversion of coupled, multi-model distortion and multi-resolution systems, according to the present invention.

A method of generalized reconstruction by inversion of coupled, multi-model distortion and multi-resolution systems according to the present invention can be illustrated by the method of reconstruction of a parallel MRI acquisition distorted by a motion of the imaged subject and by an error made on the sensitivity maps of the receiving antennae, already described above in points (1) to (35), where a second sensitivity-distortion model $\alpha_2=\sigma_y$ is introduced.

The second model is initialized (36), typically it is possible to take $$\alpha_2 \equiv \frac{1}{\gamma}$$

or also values from a previous calibration.

The reconstruction process delivers the optimized parameters of the second model (37).

The introduction of a second model makes the operator E dependent (38) on the new parameters $\alpha_2$.

Similarly for the residual operator $R_1$, itself also dependent (40) on the new parameters $\alpha_2$.

The coupled systems are written:

$$\begin{cases} s = E(\alpha)\rho_0 & \text{(generalized reconstruction error)} \\ \varepsilon_1(\rho_0, \alpha, \sigma, \delta\alpha) = R_1(\rho_0, \alpha, \sigma)\delta\alpha & \text{(model coefficient error)} \\ \varepsilon_2(\rho_0, \alpha, \sigma, \delta\sigma) = R_2(\rho_0, \alpha, \sigma)\delta\sigma & \text{(sensitivity maps error)} \end{cases} \quad \text{(Eq. 16)}$$

With the residual operator of the first model $R_1$ $$\varepsilon_1 = \begin{bmatrix} \xi_{t_1} F\hat{\sigma}_1(-\nabla\hat{\rho}_{t_1})^T \cdot \sum_{k=1}^{K} S_k(t_1)\delta\alpha_k \\ \vdots \\ \xi_{t_N} F\hat{\sigma}_1(-\nabla\hat{\rho}_{t_N})^T \cdot \sum_{k=1}^{K} S_k(t_N)\delta\alpha_k \\ \vdots \\ \xi_{t_1} F\hat{\sigma}_{N_\gamma}(-\nabla\hat{\rho}_{t_1})^T \cdot \sum_{k=1}^{K} S_k(t_1)\delta\alpha_k \\ \vdots \\ \xi_{t_N} F\hat{\sigma}_{N_\gamma}(-\nabla\hat{\rho}_{t_N})^T \cdot \sum_{k=1}^{K} S_k(t_N)\delta\alpha_k \end{bmatrix} \quad \text{(Eq. 17)}$$

$$= R_1(\rho_0, \alpha, \sigma)\delta\alpha$$

and the residual operator of the second model $R_2$ $$\varepsilon_2 = \begin{bmatrix} \xi_{t_1} F\text{diag}(\hat{\rho}_{t_1})\delta\sigma_1 \\ \vdots \\ \xi_{t_N} F\text{diag}(\hat{\rho}_{t_N})\delta\sigma_1 \\ \vdots \\ \xi_{t_1} F\text{diag}(\hat{\rho}_{t_1})\delta\sigma_{N_\gamma} \\ \vdots \\ \xi_{t_N} F\text{diag}(\hat{\rho}_{t_N})\delta\sigma_{N_\gamma} \end{bmatrix} = R_2(\rho_0, \alpha, \sigma)\delta\sigma \quad \text{(Eq. 18)}$$

The residual operator $R_2$ depends on $\alpha_1$ (41)

In the same way as for the first model (33), the optimization of the second model is carried out by solution of the inverse problem (39) of the equation (Eq. 18) using the equivalent Hermitian model, the GMRES algorithm and an adjustment corresponding to the minimization:

$$\delta\sigma^{(k)} = \min_{\delta\sigma}\{\|\varepsilon - R\delta\sigma\|^2 + \mu\|\nabla(\sigma + \delta\sigma)\|^2\}. \quad \text{(Eq 19)}$$

The optimization (39) delivers an estimation of the errors made on the parameters of the distortion model $\delta\alpha_2$ (42) as the output. Once obtained, these errors $\delta\alpha_2$ are used to update the parameters of the distortion model.

The coupled optimization of the simulation model and two distortion models is carried out by a fixed-point method, i.e. each model is optimized separately, all the others being regarded as fixed. This optimization is carried out alternately on the simulation model then on one of the two distortion models, this optimization sequence being repeated alternately on each of the models.

The optimization of the parameters of the coupled simulation and distortion models is repeated according to a primary iteration (57) of the optimization of the parameters, governed by a stop condition (58), which is limited to a fixed number of iterations, typically 8, until the Euclidian norm of the residual stops reducing. The optimum parameters are those giving the smallest residual during the stop condition.

The optimization of the parameters of the coupled simulation and distortion models is repeated according to a multi-resolution secondary iteration (59), established on the base of a level of resolution of the image (3).

At the end of the primary iteration, the parameters (3),(15), (37) have passed to the next level, the secondary iteration (43), interpolating the coefficients maps with the next level of resolution (linear interpolation).

For each level of secondary iteration, the parameters (14) and (36) are initialized using the values of the previous iteration (44) and doubling the resolution of the image. Typically the first iteration is carried out with a resolution of 32.

The initial level of resolution is chosen such that the motion can be regarded as small at this level of resolution. This initial level of resolution depends on the considered application. For a 2D clinical image having a final resolution of 256*256, the initial level of resolution is thus set at 32*32.

The stop condition of the secondary iteration is a fixed number of iterations corresponding to the maximum resolution of the acquisition, typically 4 or 5.

Figure 6:
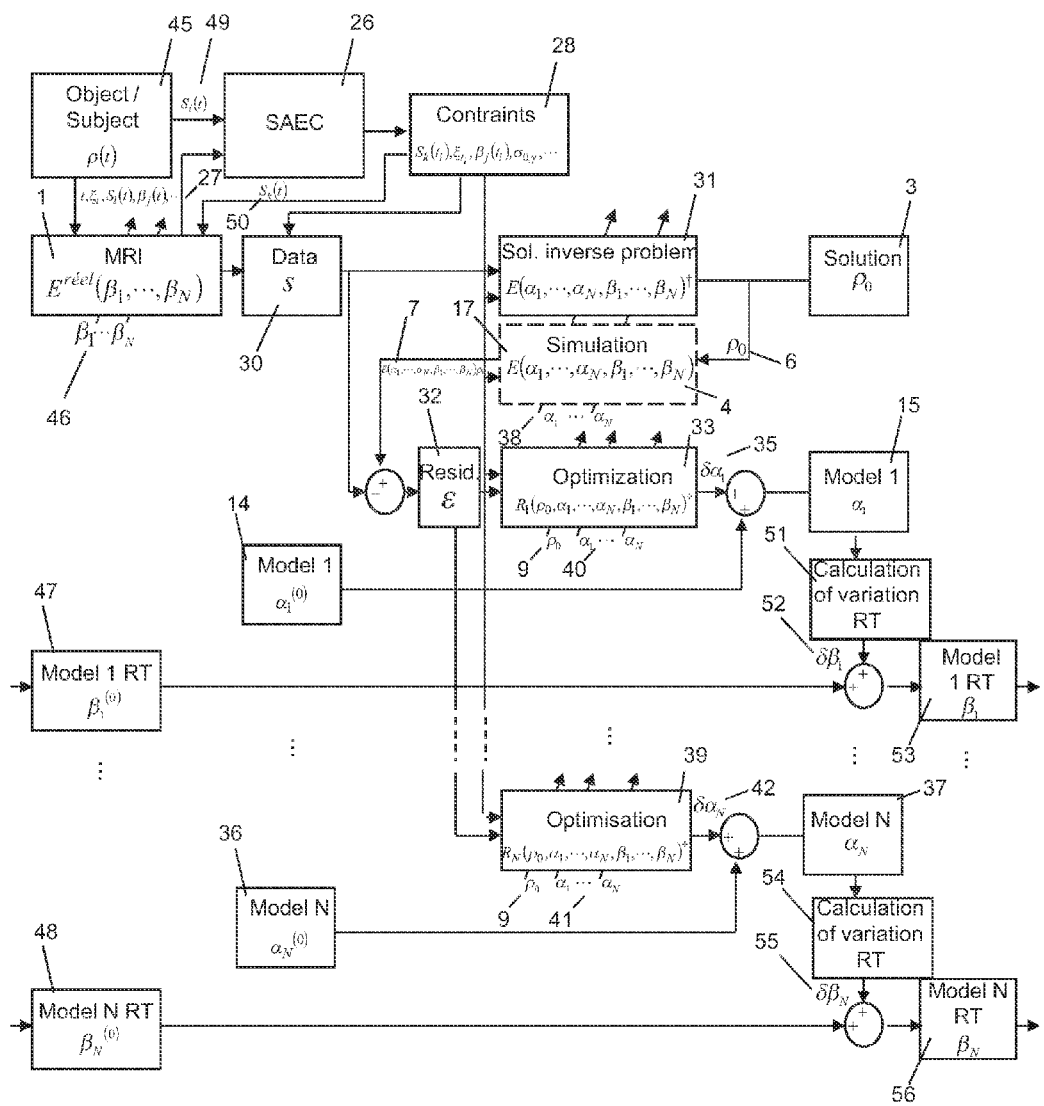

FIG. 6 represents a method of acquisition and generalized reconstruction by inversion of coupled, multi-model and adaptive systems, according to the present invention.

A method of acquisition and generalized reconstruction by inversion of coupled multi-model and adaptive systems according to the present invention can be illustrated by the parallel acquisition and MRI reconstruction method, distorted by a movement of the imaged subject and by an error made on the sensitivity maps of the receiving antennae, already described above in points (1) to (42), (57) and (58)

The subject (45) is placed in an MRI system (1), of which inter alia the MRI image acquisition resolution (46) is adjustable.

The adjustable acquisition parameters $\beta_i$ are determined by initial models (47),(48). Typically, the initial resolution is 64.

Physiological parameters such as signals from respiratory belts and ECGs are acquired in real time during the MRI acquisition (49).

The information derived from these sensors is sent to the MRI system in real time (50) and can serve to govern the models determining the adjustable acquisition parameters $\beta_i$.

Starting from the optimum parameters distortion models (15) and (37) are derived by a method (51) and (54), the values (52) and (55) serving to update the models of the adjustable acquisition parameters (53) and (56).

For the resolution of the acquisition, the size of the image derived from the dimension of the model (15) is doubled in (53).

The acquisitions are repeated until a predetermined number of iterations corresponding to the final resolution chosen, typically 256, is reached.

Figure 7:
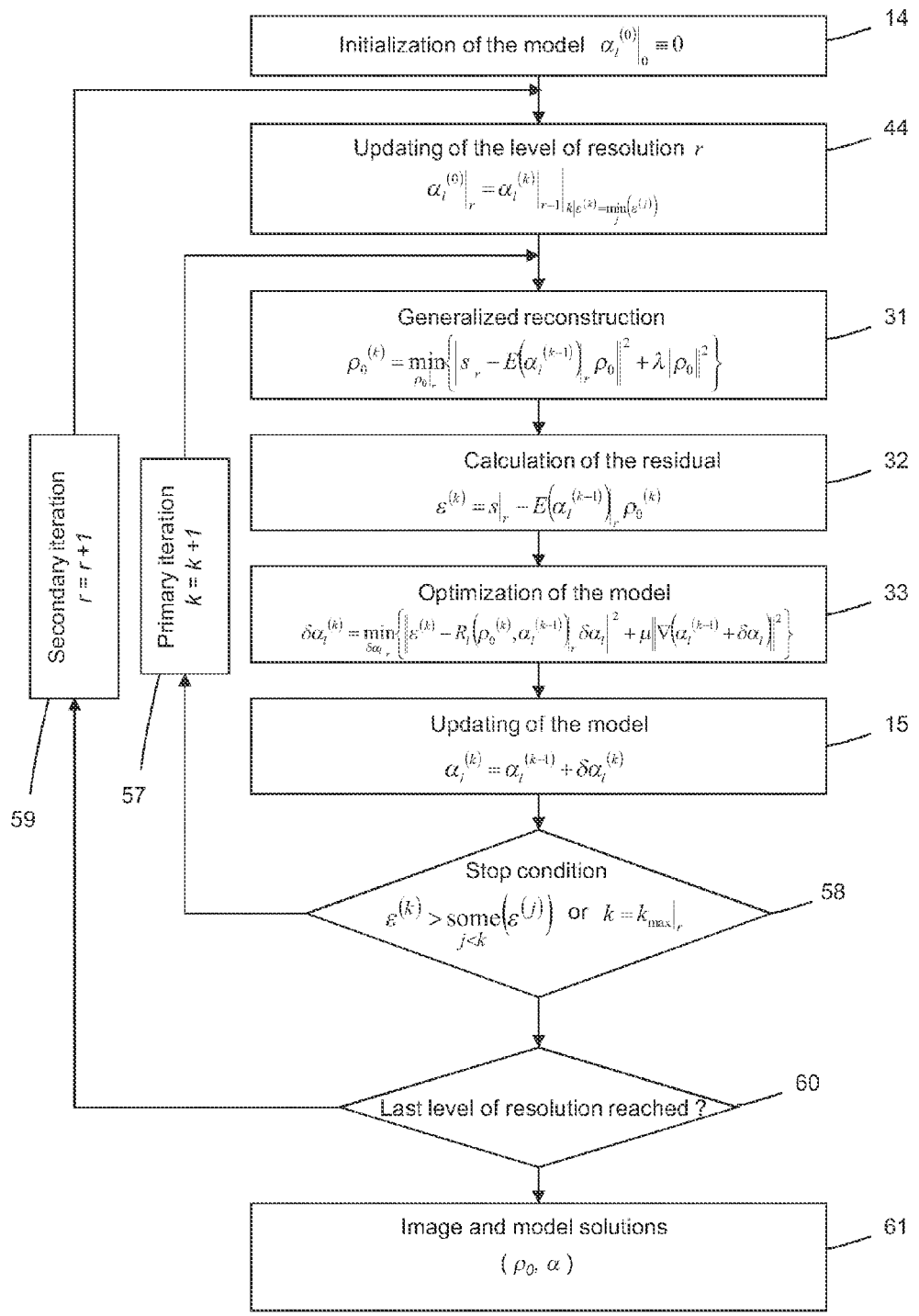

It is understood that this method of implementation can be combined with that described in FIGS. 4, 5 and 7 so as to integrate the primary and secondary iterations and the other elements appearing there.

FIG. 7 represents a method of generalized reconstruction by inversion of multi-resolution iterative coupled systems with a single model, according to the present invention.

A method of generalized reconstruction by inversion of multi-resolution iterative coupled systems with a single model according to the present invention can be illustrated by the method of reconstruction of a parallel MRI acquisition distorted by a motion of the imaged subject, already described above in points (1) to (35).

The optimization of the parameters of the coupled simulation and distortion models is repeated according to a primary iteration (57) of the optimization of the parameters, governed by a stop condition (58), which is limited to a fixed number of iterations, typically 8, until the Euclidian norm of the residual stops reducing. The optimum parameters are those giving the smallest residual during the stop condition.

The optimization of the parameters of the coupled simulation and distortion models is repeated according to a multi-resolution secondary iteration (59), established on the basis of a level of resolution of the image (3).

At the end of the primary iteration, the parameters (3) and (15), have passed to the next level, the secondary iteration.

For each level of secondary iteration, the parameters are initialized by using the values of the previous iteration (44) and doubling the resolution of the image. Typically the first iteration is carried out with a resolution of 32.

The stop condition of the secondary iteration is a fixed number of iterations (60) corresponding to the maximum resolution of the acquisition, typically 4 or 5.

The method delivers as result a stack of images and an optimum set of parameters (61).

According to another particular embodiment, the method delivers the model obtained at the penultimate level of resolution. This makes it possible to dispense with the last stage of the optimization of the model, which is the most costly in terms of processing.

Moreover, this method makes it possible to dispense with the initial step of calibration of the model describing the physiological patient motion.

In the above embodiments, the linear model is initialized (14) taking all the coefficients of the matrix $\alpha$ equal to zero, which corresponds to $\alpha^{(0)}=0$.

Advantageously, the model is calibrated initially at the initial level of resolution, prior to the iterations (57.59), in order to give a first prediction of the motion.

It is carried out on the basis of a fast MRI sequence, with low spatial resolution, but high temporal resolution and shows the dynamics of the motion. It also exploits an algorithm for detecting motion or recalibrating images.

The model is calibrated specifically for each patient, and for a given sensors configuration. Once the calibration has been carried out, the parameters $\theta(t)$ describing the actual patient motion are predicted by the product of $\alpha$ with the new values provided by the input signals.

Several types of signals can be used as model inputs: signals from MRI data and signals from external sensors. Signals from the MRI (navigator echoes, centre lines of the K-space . . . ) make it possible to give an item of image information directly and to monitor the surface motion or the internal motion of organs. Data from external sensors make it possible to predict the motion independently of the MRI acquisition.

The partial information, extracted from the data of the external sensors or from the MRI data, constitute the model input signals. For other applications, for example monitoring a cardiac cycle, it is possible to use prototype curves indicating the variations of the signal over time.

The model input is constituted of K signals that are functions of time, called $S(t)=[S_1(t) \ldots S_K(t)]^T$. As outputs, the model has a set of P parameters describing the motion in the plane or the volume of interest, i.e. $\theta(t)=[\theta_1(t) \ldots \theta_P(t)]^T$. The model outputs can be either spatial transformation parameters, such as affine transformation parameters, or complete displacement fields, sampled on a Cartesian grid for example, or also a combination of the two (affine transformation and locally free deformations).

The model is described by the following relationship, subject to an error $\epsilon$:

$$\begin{bmatrix} \theta_1(t) \\ \vdots \\ \theta_P(t) \end{bmatrix} = \begin{bmatrix} \alpha_{1,1} & \ldots & \alpha_{1,K} \\ \vdots & & \vdots \\ \alpha_{P,1} & \ldots & \alpha_{P,K} \end{bmatrix} \cdot \begin{bmatrix} S_1(t) \\ \vdots \\ S_K(t) \end{bmatrix} + \varepsilon(t) \quad \text{(Eq. 20)}$$

Or also:

$$\theta(t) = \alpha \cdot S(t) + \varepsilon(t) \quad \text{(Eq. 21)}$$

It is thus assumed that the temporal course of the parameters describing motion can be approached by linear combinations of the input signals.

Once the input and output data are obtained, the determination of the coefficients of the linear model, i.e. the coefficients of the matrix $\alpha$, is carried out according to a multi-variable regression.

This initial calibration step makes it possible to obtain a first prediction of the motion of the organ before the start of the iterations, and thus to obtain a more rapidly converging optimization.

An MRI device can be produced according to the present invention. This device comprises means for the acquisition and processing of MRI images, and implements a method of correcting physiological motion by MRI reconstruction of images according to one of the variants of the above-described method. Such a device can also use the model established by the reconstruction in order to modify its acquisition.

The above-described method of implementation of the present invention is given by way of example and is in no way limitative. It is understood that a person skilled in the art is capable of realizing different variants of the invention without thereby exceeding the scope of the invention.

The above-described embodiments of the present invention are given by way of invention and are in no way limitative. It is understood that a person skilled in the art is capable of realizing different variants as well as different combinations of these embodiments of the invention without thereby exceeding the scope of the invention.

The above-described invention can apply to other MRI reconstruction problems requiring an improved modelling of the acquisition chain, in particular:
  taking account of the explicit dependence of the antenna sensitivities as a function of time when correcting physiological motion, when antennae are mobile or when sensitivities vary with respiration due to variations in antenna load;
  simple determination of said antenna sensitivities;
  modelling of the variations in intensities due, for example, to the injection of a contrast product;
  correction of artefacts due to differences in homogeneity of intensities, for example for the determination of images in water and in fat;
  the correction of artefacts specific to certain sequences or trajectories, such as phase shifts during multi-echo sequences or deformations of trajectories during spiral acquisitions.

More generally, the invention is applicable to any distortion of MRI acquisition capable of being modelled, preferably in linear manner.

The invention can also be used within the framework of the prospective correction of the distortions, in real time during the MRI acquisition.

The invention is applicable to other inverse problems, for example for signals other than images, including nuclear magnetic resonance (NMR), where it is possible to acquire spectra (spectroscopy or spectroscopic imaging).

The invention is not limited to the embodiments described and illustrated. According to further particular embodiments:
  a device allowing the acquisition of supplementary experimental measurements is a signal analyzer and event controller (SAEC).
  events relating to the acquisition of experimental measurements of primary interest and the acquisition of supplementary experimental measurements, such as acquisition times and the order of data acquisition are synchronized.
  the device allowing the acquisition of supplementary experimental measurements comprises at least one external sensor and transmits these measurements as well as events relating to the acquisition of these measurements to a module dedicated to the processing of the set of measurement data.
  the device allowing the acquisition of supplementary experimental measurements comprises at least one navigator echo and transmits these measurements as well as events relating to the acquisition of these measurements to a module dedicated to the processing of the set of measurement data.
  the device for acquiring experimental measurements of primary interest acquires the experimental measurements of primary interest and transmits the data from the processing of these measurements as well as the events relating to the acquisition of these measurements to a module dedicated to the processing of the set of measurement data.
  the supplementary experimental measurements are transmitted to a data preparation module.
  the experimental measurements of primary interest are distorted by the motion of the subject or of the object placed in the device for acquiring these experimental measurements.
  the experimental measurements of primary interest are distorted by an error in estimating the sensitivity of the radiofrequency reception antennae.
  the spatial transformation operator is modelled by at least one motion distortion model.
  the motion distortion model can be broken down into a set of parameters describing the spatial dependence of the model and at least one item of information correlated with the motion at the different acquisition times of the experimental measurements.
  at least one motion distortion model is linear, i.e. models the temporal course of the parameters describing the motion by linear combinations of signals from the supplementary experimental measurements.
  at least one antennae sensitivity operator is modelled by at least one sensitivity-distortion model.

at least one sensitivity-distortion model can be broken down into a set of parameters describing at least one antenna sensitivity map.

the method includes a module dedicated to data processing, sorting the experimental measurement data of primary interest to which similar constraints are applied within the framework of the reduction in the number of parameters describing the simulation and distortion models, these similar constraints being based on similar supplementary experimental measurement data. Said module dedicated to data processing then produces at least one sorted supplementary experimental datum and at least one index describing said sorting of the experimental measurement data of primary interest. Advantageously, the module dedicated to data processing transmits at least one index to the data preparation module.

at least one index is determined by quantifying the supplementary experimental measurement data variation space in order to obtain a small number of indices adequately describing the causes of the distortions.

the method includes a data preparation module which, using each index, combines the elementary experimental measurements of primary interest into sets corresponding to the separate sub-elements of the simulation model indexed by this same index.

the data preparation module carries out one or more pre-transforms of the elementary experimental acquisitions.

the pre-transform is a Fourier transform in the direction or directions independent of the motion distortion, making it possible to simplify accordingly the Fourier transform encoding operator of the simulation model.

the operator of at least one simulation model is broken down into sub-elements indexed by the indices produced by the module processing external data.

the elementary experimental acquisitions of primary interest, combined in indexed sets, are the distorted experimental data to be reconstructed.

the data of the sorted supplementary experimental measurements are the supplementary experimental data used to constrain the motion distortion model.

the signal from the solution of the inverse problem of the simulation is used in order to generate the result of the simulation model, the difference between the experimental measurements and said result of the simulation model being used as a criterion for the optimization of the coupled simulation and distortion models.

A reconstruction residual is calculated from the difference between the experimental measurements and said result of the simulation model.

for each distortion model, the difference between the optimum parameters and the current parameters of the distortion model is the error on the parameters of the distortion model. Said reconstruction residual is modelled by a residual operator applying to the error on the parameters of the distortion model. This residual operator is a function of the current parameters of the simulation and distortion models.

for minor errors on the parameters of the distortion model, said residual operator is linear.

for the motion distortion model, introducing the assumption of local preservation of the signal, and using a linear motion distortion model as described previously, the residual operator is composed of the linear operators appearing in the simulation operator, and a composition of the current signal of the gradient and the supplementary experimental measurement data.

for the sensitivity-distortion model, exploiting the fact that the expression of the sensitivity variations is diagonal, the residual operator is written in the same way as the simulation operator replacing the sensitivity operator by a diagonal operator, the diagonal of which is constituted by the resultant of the composition of the current signal by the translation operator.

the optimization of the parameters of the distortion model is carried out by the solution of the inverse problem described by the residual operator, taking as input said reconstruction residual and delivering as the output an estimation of the errors made on the parameters of the distortion model. Once obtained, these errors made on the parameters of the distortion model are used to update the parameters of the distortion model.

the solution of the inverse problem is carried out by resolving the equivalent Hermitian symmetry problem.

the solution of the inverse problem is carried out by an iterative method which does not require explicit knowledge of the complete Hermitical operator.

said iterative method is a Krylov method, such as the conjugate gradient, Generalized Minimal Residual Method (GMRES), or biconjugate gradient.

the solution of the inverse problem includes at least one regularization.

the regularization constraint is of the Tikhonov regularization type on the parameters of the distortion model plus the errors on the parameters of the distortion model.

the regularization constraint is of the constraint type on the spatial gradient of the parameters of the distortion model, plus the errors on the parameters of the distortion model, of the Tikhonov constraint or total variation restriction method type.

for the solution of the inverse problems for the optimization of the parameters of the simulation and distortion models that is carried out by an iterative method, the calculation of the sub-assemblies of the operators is parallelized on separate computers.

the coupled optimization of said parameters of the simulation and distortion models is carried out by a method known as fixed point, i.e. in which each model is optimized separately, all the others being regarded as fixed.

the signal is a multi-dimensional, in particular 2D and 3D, MRI image.

the choices of initializations of the parameters of the simulation and distortion models are derived from acquisitions called "calibration" acquisitions obtained from the device acquiring the experimental measurements of primary interest and optionally of the device acquiring the supplementary experimental measurements.

the method of the invention is included in a system where the device acquiring the experimental data contains adjustable parameters, and where the operators describing the different simulation and distortion models take account of this adjustment possibility.

the adjustable parameters are functions of the parameters of the optimized distortion models.

the adjustable parameters are updated once the optimum parameters of the simulation and distortion models are established.

the updating of said adjustable parameters is repeated according to an iteration governed by a stop condition.

the adjustable parameter is the resolution of the MRI image, and the parameter updating function is the doubling of the current resolution of the optimum image, the stop condition being the predefined size.

the adjustment parameters are affine transformation parameters of the MRI acquisition volume, and the updating function is an affine transformation model of the MRI acquisition volume dependent in real time on the supplementary experimental measurements, the parameters of which are adjusted on the basis of the estimated affine transformations on a region of interest, for example deduced from the parameters of the motion distortion model. In a particular embodiment, the stop condition is a predefined number of iterations.

When a distortion model comprises a large number of parameters, this number of parameters can be reduced, for example, using a supplementary constraint provided by supplementary experimental measurements, such as for example a constraint exploiting the correlation of the parameters of the distortion model with signals from physiological recording, such as signals from respiratory sensors, electrocardiograms (ECGs), or MRI navigators.

The invention claimed is:

1. Method for acquiring motion-disturbed experimental measurements of a physical phenomenon corresponding to experimental measurements obtained by a medical imaging or spectroscopy technique from the group consisting of MRI, NMR spectroscopy, scanner, and PET, and for reconstructing a reconstructed signal, the method implemented with a medical imaging or spectroscopy device comprising:
   at least one data acquisition process of obtaining raw data of said experimental measurements by said medical imaging or spectroscopy technique from the group consisting of MRI, NMR spectroscopy, scanner, and PET, said at least one data acquisition process comprising at least one disturbance, said at least one disturbance comprising a motion;
   at least one simulation model simulating said at least one data acquisition process, said at least one simulation model
   i) receiving, as input, a current signal $\rho$ in a form of a voxel, an image, a stack of images, or a volume, the current signal $\rho$ representing the physical phenomenon and being a function of the obtained raw data of the experimental measurements, and
   ii) providing, as output, simulated experimental data in a same form as a form of the obtained raw data of the experimental measurements, the form of the simulated experimental data and of the obtained raw data of the experimental measurements being distinct from a form of the current signal $\rho$; and
   at least one distortion model of said at least one disturbance of said data acquisition process, said at least one distortion model being determined at least from the experimental measurements obtained by the medical imaging or spectroscopy technique in said at least one data acquisition process, wherein,
   said simulation and distortion models comprise distinct adjustable parameters dependent on the experimental measurements obtained by the medical imaging or spectroscopy technique in said at least one data acquisition process, said distinct adjustable parameters comprising i) the current signal $\rho$ and ii) parameters $\alpha$ of the distortion model,
   said simulation and distortion models are coupled in the sense that the simulation model depends on the adjustable parameters $\alpha$ of the distortion model, and
   said adjustable parameters $\rho$ and $\alpha$ are optimized jointly, the optimization providing, as output, i) the reconstructed signal corresponding to an optimized current signal $\rho$ and representing a result of the reconstructed signal corrected of distortions, and ii) the parameters $\alpha$ of the distortion model,
   wherein the optimization of said parameters of the at least one simulation model is carried out by solving an inverse problem of the at least one simulation model, taking the experimental measurements as inputs and solving an equivalent Hermitian symmetry problem,
   wherein, the current signal issued from the solution of the inverse problem of the at least one simulation model is used to generate the simulated experimental data, a difference between said experimental measurements and said simulated experimental data is used as optimization criterion for said coupled simulation and distortion models, and a reconstruction residual is calculated from the difference between said experimental measurements and said simulated experimental data, and
   wherein said reconstruction residual is modeled by a residual operator, said residual operator taking an estimate of errors of the parameters of the distortion model as input and providing said reconstruction residual as output, and being a function of current parameters $\rho$ and $\alpha$ of the simulation and distortion models.

2. Method according to claim 1, further comprising an acquisition of supplementary experimental measurements to be acquired to supplement said experimental measurements obtained by the medical imaging or spectroscopy technique, said supplementary experimental measurements being used to restrict the distortion model.

3. Method according to claim 2, further comprising a step of acquiring the experimental measurements and preparing a reconstruction of the reconstructed signal, said step comprising:
   the acquisition of the experimental measurements and the supplementary experimental measurements, said supplementary experimental measurements coming from at least one of: an external sensor, a navigator echo, and the experimental measurements; and
   a synchronization of events relating to the acquisition of the experimental measurements and the acquisition of the supplementary experimental measurements.

4. Method according to claim 3, wherein the preparation of the reconstruction comprises a sorting operation of the experimental measurements into experimental measurements to which substantially identical constraints are applied,
   said substantially identical constraints being based on supplementary experimental measurements data having a same quantized value,
   said sorting operation producing at least one sorted supplementary experimental measurement datum and at least one set of indices of interest describing said sorting of the experimental measurement data, and
   said experimental measurements being combined into at least one set corresponding to said set of indices of interest.

5. Method according to claim 4, wherein said at least one set of indices of interest is determined by operating a quantization of a variation space of the supplementary experimental measurement data.

6. Method according to claim 4, wherein an operator of at least one of the simulation and distortion models is broken down into at least one sub-element indexed by said indices of interest,
   said experimental measurements, combined into indexed sets, being distorted experimental data to be reconstructed, and said supplementary experimental measurements data sorted according to said indices of interest being the supplementary experimental data used to constrain said at least one distortion model.

7. Method according to claim 3, wherein said preparation of the reconstruction comprises at least one pre-transform of the experimental measurements.

8. Method according to claim 2, further using adjustable acquisition parameters,
said adjustable acquisition parameters being taken into account by the simulation and distortion models,
said adjustable acquisition parameters being a function of the optimized parameters of the distortion model,
said adjustable acquisition parameters being updated once the optimal parameters of said simulation and distortion models have been established, and
said updating of said adjustable acquisition parameters being repeated according to an iteration governed by a stop condition.

9. Method according to claim 8, wherein,
said adjustable acquisition parameters are affine transformation parameters of an MRI acquisition volume,
said updating of said adjustable acquisition parameters is performed using an affine transformation model of the MRI acquisition volume, and
said updating of said adjustable acquisition parameters depends in real time on the supplementary experimental measurements.

10. Method according to claim 1, wherein the optimization of said adjustable parameters $\rho$ and $\alpha$ of the simulation and distortion models is carried out using
a cost function quantifying a discrepancy between at least a part of the raw data from the experimental measurements and at least a part of the corresponding simulated experimental data reconstructed by the at least one simulation model.

11. Method according to claim 1, wherein the optimization of said adjustable parameters $\rho$ and $\alpha$ of the simulation and distortion models comprises at least a step of minimizing a reconstruction residual defined as a discrepancy between at least a part of the raw data from the experimental measurements and at least a part of the corresponding simulated experimental data reconstructed by the at least one simulation model.

12. Method according to claim 11, wherein,
the optimization of said parameters $\rho$ and $\alpha$ of said simulation and distortion models is carried out using a fixed-point method,
each model is optimized separately, all of the other models being regarded as fixed, and
said optimization is carried out alternately on each model.

13. Method according to claim 12, wherein,
said optimization of the parameters $\rho$ and $\alpha$ of the simulation and distortion models is repeated according to a primary iteration,
the optimal parameters $\rho$ and $\alpha$ are those that result in a smallest reconstruction residual, and
said primary iteration is governed by a stop condition which is established by any one of the following criteria:
a difference between said reconstruction residuals during two separate incrementations of the primary iteration,
a predetermined minimum value of said residual, or
a predetermined number of iterations.

14. Method according to claim 12, wherein said optimization of the parameters $\rho$ and $\alpha$ of the simulation and distortion models is repeated according to a secondary multi-resolution iteration established on a basis of a level of resolution of the reconstructed signal.

15. Method according to claim 1, wherein said simulation model is produced in the form of a linear operator.

16. Method according to claim 1, wherein the solution of said inverse problem of the at least one simulation model is carried out using an iterative method that does not require explicit knowledge of a complete Hermitian operator.

17. Method according to claim 1, wherein said residual operator comprises linear operators appearing in a simulation operator of the at least one simulation model, and a composition of a gradient of the current signal $\rho$ representing the experimental measurements and the supplementary experimental measurement data acquired to supplement the experimental measurements.

18. Method according to claim 1, wherein said residual operator is linear.

19. Method according to claim 18,
wherein the at least one simulation model is produced in the form of a linear operator comprising:
a spatial transformation operator, modelled by said distortion model,
an antenna sensitivity weighting operator,
an encoding operator, and
a Cartesian grid sampling operator.

20. Method according to claim 19, wherein said spatial transformation operator is an elastic spatial transformation operator making it possible to take locally free deformations into account.

21. Method according to claim 19, wherein said spatial transformation operator is modelled by at least one motion-distortion model,
said motion distorting the experimental measurements,
said motion-distortion model being capable of being broken down into a set of parameters describing a spatial dependence of the said motion-distortion model, and at least one item of information correlated to the motion at different acquisition times of the experimental measurements, and
said motion-distortion model being linear, modelling changes over time of parameters describing motion by linear combinations of signals from said supplementary experimental measurements.

22. Method according to claim 19,
(i) wherein said antenna sensitivity weighting operator is modelled by at least one sensitivity-distortion model, said sensitivity-distortion model being capable of being broken down into a set of parameters describing at least one antenna sensitivity map, and
(ii) the method further implementing a further residual operator which is a function of the same operators as included in the linear operator, with the said antenna sensitivity weighting operator replaced by a diagonal operator, a diagonal of which is constituted by a resultant of the composition of the current signal by said spatial transformation operator.

23. Method according to claim 19, wherein said encoding operator is an operator of the Fourier transform type.

24. Method according to claim 1, wherein,
the optimization of the parameters $\alpha$ of the distortion model is carried out by solving an inverse problem described by said residual operator, said solution of the inverse problem being carried out by solving an equivalent Hermitian symmetry problem, and said estimate of the errors made on the parameters α of the distortion model is used to update the parameters α of the distortion model.

25. Method according to claim 24, wherein said solution of the inverse problem described by the residual operator is carried out using an iterative method that does not require explicit knowledge of a complete Hermitian operator, and comprises a regularization of one of the following types:
- a Tikhonov regularization involving the parameters of the distortion model plus the estimate of errors on the parameters α of said distortion model, and
- a constrain-type adjustment involving a square of a norm of a spatial gradient of the parameters α of the distortion model plus the errors on the parameters α of said distortion model.

26. Method according to claim 1, wherein said reconstructed signal is reconstructed as at least one spectrum of at least one NMR spectroscopy voxel.

* * * * *